(12) United States Patent
Lewis et al.

(10) Patent No.: US 7,304,499 B1
(45) Date of Patent: Dec. 4, 2007

(54) DISTRIBUTED RANDOM ACCESS MEMORY IN A PROGRAMMABLE LOGIC DEVICE

(75) Inventors: David Lewis, Toronto (CA); Paul Leventis, Toronto (CA); Vaughn Betz, Toronto (CA)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 11/454,815

(22) Filed: Jun. 16, 2006

Related U.S. Application Data

(62) Division of application No. 10/897,743, filed on Jul. 22, 2004, now Pat. No. 7,084,665.

(51) Int. Cl.
*G06F 7/38* (2006.01)
*H03K 19/177* (2006.01)

(52) U.S. Cl. .............................. 326/40; 326/37; 326/38
(58) Field of Classification Search ............ 326/37–41, 326/46
See application file for complete search history.

(56) References Cited

U.S. PATENT DOCUMENTS

| | | | |
|---|---|---|---|
| 5,343,406 A | 8/1994 | Freeman et al. ............. 364/490 |
| 5,352,940 A | 10/1994 | Watson ........................ 307/465 |
| 5,414,377 A | 5/1995 | Freidin ........................ 326/41 |
| 5,432,719 A | 7/1995 | Freeman et al. ............. 364/579 |
| 5,550,782 A | 8/1996 | Cliff et al. ............... 365/230.03 |
| 5,566,123 A | 10/1996 | Freidin et al. ........... 365/230.05 |
| 5,572,148 A | 11/1996 | Lytle et al. .................... 326/41 |
| 5,648,732 A | 7/1997 | Duncan ........................ 326/40 |
| 5,796,269 A | 8/1998 | New ............................ 326/40 |
| 5,889,413 A | 3/1999 | Bauer .......................... 326/40 |
| 6,029,236 A | 2/2000 | Steele et al. ................. 711/170 |
| 6,128,215 A | 10/2000 | Lee ............................ 365/154 |
| 6,208,163 B1 | 3/2001 | Wittig et al. .................. 326/39 |
| 6,215,326 B1 | 4/2001 | Jefferson et al. .............. 326/41 |
| 6,249,143 B1 | 6/2001 | Zaveri et al. .................. 326/40 |
| 6,356,110 B1 | 3/2002 | Reddy et al. .................. 326/41 |
| 6,411,124 B2 | 6/2002 | Lee et al. ..................... 326/41 |
| 6,462,577 B1 * | 10/2002 | Lee et al. ..................... 326/40 |

OTHER PUBLICATIONS

P. Chow et al., "A 1.2:m CMOS FPGA using Cascaded Logic Blocks and Segmented Routing", *FPGAs*, Chapter 3.2, pp. 91-102, W.R. Moore and W. Luk (eds.), Abingdon EE&CS Books, Abingdon (UK) 1991, no month.

(Continued)

*Primary Examiner*—Anh Q. Tran
(74) *Attorney, Agent, or Firm*—Ropes & Gray LLP; Jeffrey H. Ingerman

(57) ABSTRACT

Distributed random access memory in a programmable logic device uses configuration RAM bits as bits of the distributed RAM. A single write path is used to provide both configuration data and user write data. Selection circuitry, such as a multiplexer, is used to determine whether the single write path carries configuration data or user write data. In another aspect of the invention, the configuration RAM bits are used as to construct a shift register by adding pass transistors to chain the configuration RAM bits together, and clocking alternate pass transistors with two clocks 180° out of phase with one another.

11 Claims, 20 Drawing Sheets

OTHER PUBLICATIONS

L. Mintzer, "FIR Filters with the Xilinx FPGA", FPGA '92 #129-#134, no month, 1992.

"Optimized Reconfigurable Cell Array (ORCA) Series Field-Programmable Gate Arrays", Advance Data Sheet, AT&T Microelectronics, Feb. 1993, pp. 1-36 and 65-87.

*The Programmable Logic Data Book*, 1994, Xilinx, Inc., San Jose, CA, cover pages and pp. 2-5 through 2-102 ("XC4000 Logic Cell Array Families"), no month.

B. Klein, "Use LFSRs to Build Fast FPGA-Based Counters", *Electronic Design*, Mar. 21, 1994, pp. 87, 88, 90, 94, 96, 97 and 100.

A. DeHon, "Reconfigurable Architectures for General-Purpose Computing", M.I.T. Ph.D. thesis, Sep. 1996.

R. Iwanczuk, "Using the XC4000 RAM Capability", XAPP 031. 000, Xilinx, Inc., San Jose, CA, no date.

J.R. Hauser et al., "Garp: A MIPS Processor with a Reconfigurable Coprocessor", 0-8186-8159-4/97 $10.00 © 1997 IEEE, pp. 12-21, no month.

A. Ohta et al., "New FPGA Architecture for Bit-Serial Pipeline Datapath", 0-8186-8900-5/98 $10.00 © 1998 IEEE, pp. 58-67, no month.

"XC4000E and XC4000X Series Field Programmable Gate Arrays: Product Specifications", May 14, 1999 (Version 1.6), Xilinx, Inc., San Jose, CA, pp. 6-5 through 6-72.

"Flex 10K Embedded Programmable Logic Family", Data Sheet, Jun. 1999, ver. 4.01, Altera Corporation, San Jose, CA, pp. 1-137.

"Flex 10KE Embedded Programmable Logic Family", Data Sheet, Aug. 1999, ver. 2.02, Altera Corporation, San Jose, CA, pp. 1-120.

"XC4000XLA/XV Field Programmable Gate Arrays: Product Specification", DS015 (v1.3) Oct. 18, 1999, Xilinx, Inc., San Jose, CA, pp. 6-157 through 6-170.

"Triscend E5 Configurable System-on-Chip Family", Triscend Corporation, Jan. 2000 (Version 1.00) Product Description, cover page and pp. 25-28.

"Apex 20K Programmable Logic Device Family", Data Sheet, Mar. 2000, ver. 2.06, Altera Corporation, San Jose, CA, pp. 1-208.

"Virtex 2.5V Field Programmable Gate Arrays", DS003 (v.2.0), Preliminary Product Specification, Mar. 9, 2000, Xilinx, Inc., San Jose, CA, pp. 1-72.

"Virtex-E 1.8V Extended Memory Field Programmable Gate Arrays", DS025 (v1.0) Mar. 23, 2000, Advance Product Specification, Xilinx, Inc., San Jose, CA, pp. 1 and 6.

* cited by examiner

DISTRIBUTED RANDOM ACCESS MEMORY IN A PROGRAMMABLE LOGIC DEVICE

CROSS REFERENCE TO RELATED APPLICATION

This is a division of commonly-assigned U.S. patent application Ser. No. 10/897,743, filed Jul. 22, 2004, now U.S. Pat. No. 7,084,665.

BACKGROUND OF THE INVENTION

This invention relates to using the configuration bits of a programmable logic device as distributed random access memory ("RAM"). More particularly, this invention relates to reducing the costs of circuitry needed to implement distributed RAM in a programmable logic device.

A common type of programmable logic device ("PLD") in use today uses static RAM bits to configure programmable logic components to implement a user logic design. It is known to provide circuitry in a PLD to allow a user to configure those configuration bits in otherwise unused portions of the PLD to function as RAM. For example, in some user designs, it may be more advantageous to use unused configuration bits as RAM rather than using a separate RAM device, because the amount of RAM needed is small, or because using on-chip RAM is faster. A RAM formed from such distributed configuration bits may be referred to as "distributed RAM."

Contemporary PLDs are typically organized in a hierarchical structure, with basic logic units or elements arranged in groups which share local interconnection resources and other local resources. The configuration RAM bits typically are written to only during programming or configuration, and subsequently are not written to during normal device operation. Moreover, during configuration, it is typical for several bits to be written at once. Therefore, in previous attempts to use configuration memory as distributed RAM, decoders have been provided to allow the configuration bits to be written to individually. Those decoders have included a decoder for some group of configuration bits, plus up to three additional transistors per bit. In addition, separate signal paths for writing data into the distributed RAM have been added. As more transistors and signal paths are added to accommodate the distributed RAM, additional area is required and the cost increases, or alternatively the number of logic elements that can be made available for inclusion in distributed RAM must be limited, which limits user flexibility.

It would be desirable to be able to provide distributed RAM in a PLD at lower cost and with greater flexibility than has heretofore been possible.

SUMMARY OF THE INVENTION

The present invention provides distributed RAM at lower cost by sharing the signal path for writing data into the distributed RAM as well as for configuration of the PLD. This is combined with a decoder which can be amortized over a plurality of logic elements, and therefore requires fewer additional transistors or switches in the individual logic elements.

As discussed in more detail below, a number of variations of decoder and signal path combinations according to the present invention are possible, providing different tradeoffs of speed and area. Moreover, the invention uses a lower cost write data path when such a path is necessary, allowing all bits of RAM to be used as distributed RAM.

In one preferred embodiment, each decoder provides decoded write address signals to one of the aforementioned groups of logic elements in the hierarchical structure of the PLD. Because by definition it must be possible to write configuration data to all logic elements, the availability of write address signals allows any logic element in a group that is provided with a decoder to be configured as part of the distributed RAM. In one variant of this embodiment, each group of logic elements is provided with a decoder, so that any or all of the logic elements in the PLD may be configured as part of the distributed RAM. In another variant of this embodiment, only some of the groups are provided with decoders, limiting which logic elements (by their group membership) may be included in the distributed RAM. Logic elements that cannot be included in the distributed RAM are limited to being used only for programmable logic functions, while those that can be included in the distributed RAM also can be used for programmable logic functions.

In another embodiment, in PLDs where the groups of logic elements are large—i.e., contain large numbers of logic elements—it may be desirable to limit the number of logic elements, even within a single group, to which the decoder is connected, and thus which may be included in the distributed RAM. Similarly, in another embodiment, even with a single logic element, if it is large enough as discussed below, only some of the configuration bits may be included in the distributed RAM, with the remainder of the logic element limited to programmable logic functions. In particular, in a PLD where a logic element has multiple outputs—e.g., in the case of a shared LUT mask look-up-table-type logic element—it may be possible to configure the RAM with multiple ports, or to use part of the logic element as RAM and part of the logic element as logic.

In accordance with another aspect of the invention, the configuration RAM bits of a PLD can be used to create a shift register. In this arrangement, each shift register stage may be formed from two configuration RAM bits, together with from one to three additional transistors between each bit.

BRIEF DESCRIPTION OF THE DRAWINGS

The above and other advantages of the invention will be apparent upon consideration of the following detailed description, taken in conjunction with the accompanying drawings, in which like reference characters refer to like parts throughout, and in which.

DETAILED DESCRIPTION OF THE INVENTION

The invention will now be described with reference to FIGS. 1-26.

Figure 1:
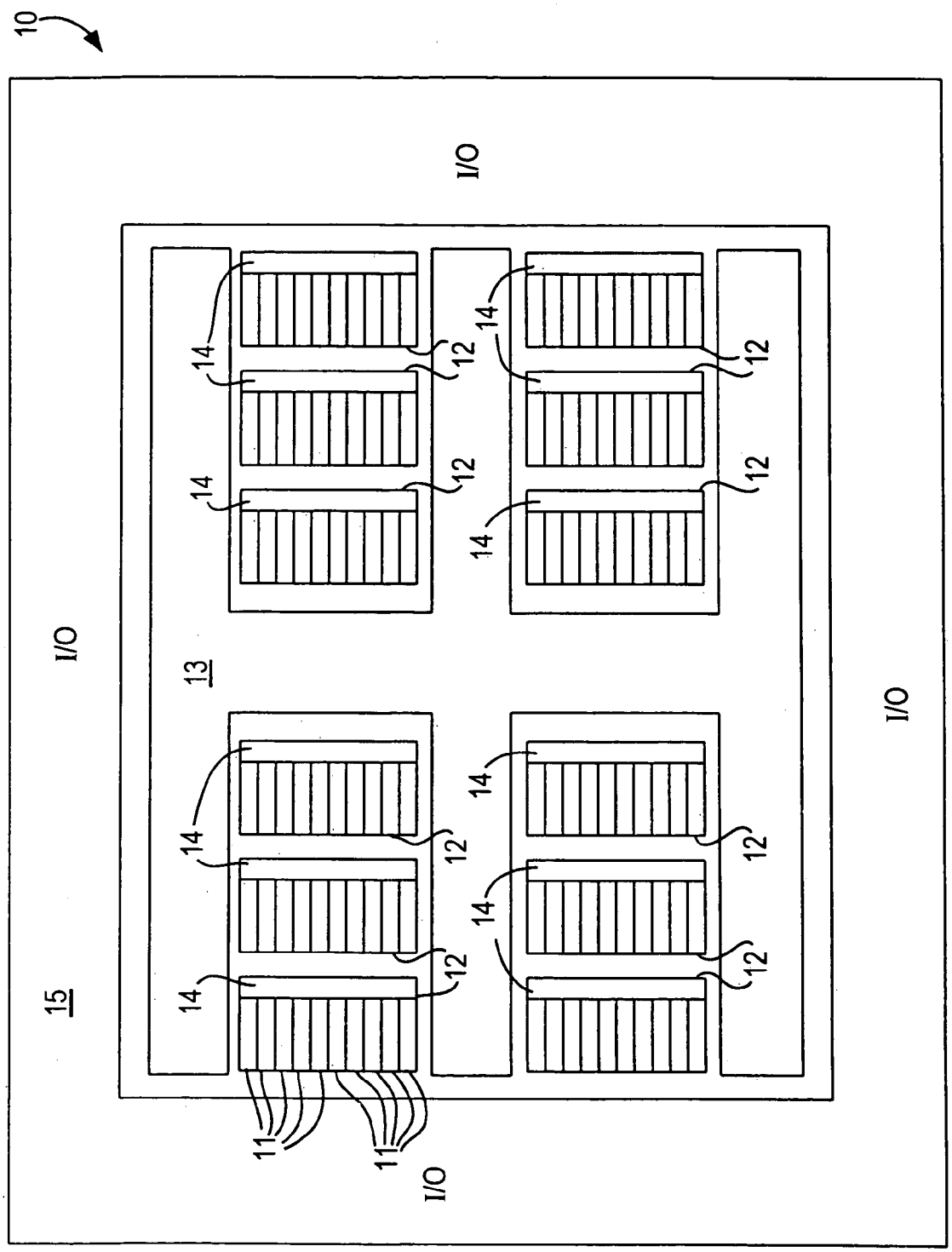
FIG. 1 is a schematic representation of a programmable logic device in which the present invention may be used.

FIG. 1 shows a representation of a PLD 10 that may incorporate the invention. PLD 10 includes a plurality of logic cells or elements (LEs) 11, arranged in groups or "logic array blocks (LABs)" 12, interconnected by routing shown generally at 13. Routing, shown schematically at 14 also exists inside LABs 12 to interconnect LEs 11. As described above, each LE 11 includes a plurality of RAM bits used for configuration. A typical LE may be configured as a four-input look-up table, having sixteen configuration bits. Input/output regions 15 preferably are located adjacent the edges of PLD 10.

PLD 10 may optionally include blocks of RAM (not shown). Whether or not such blocks are present, it may be desirable to use some or all of the configuration bits as distributed user RAM (or read-only memory (ROM)). A typical LE normally already includes the necessary circuitry for reading as distributed RAM. For example, LEs of PLDs manufactured by Altera Corporation, of San Jose, Calif., the assignee hereof, may use a 16:1 multiplexer with four control lines to select one of sixteen bits based on the states of the four control lines. However, the situation is different for writing. For configuration purposes, the sixteen bits normally are written more than one at a time—e.g., four at a time. This is acceptable for configuring a PLD, and even for loading a RAM before initial use, but during RAM operation, it is necessary to be able to write, and therefore to address, one bit at a time.

Figure 2:
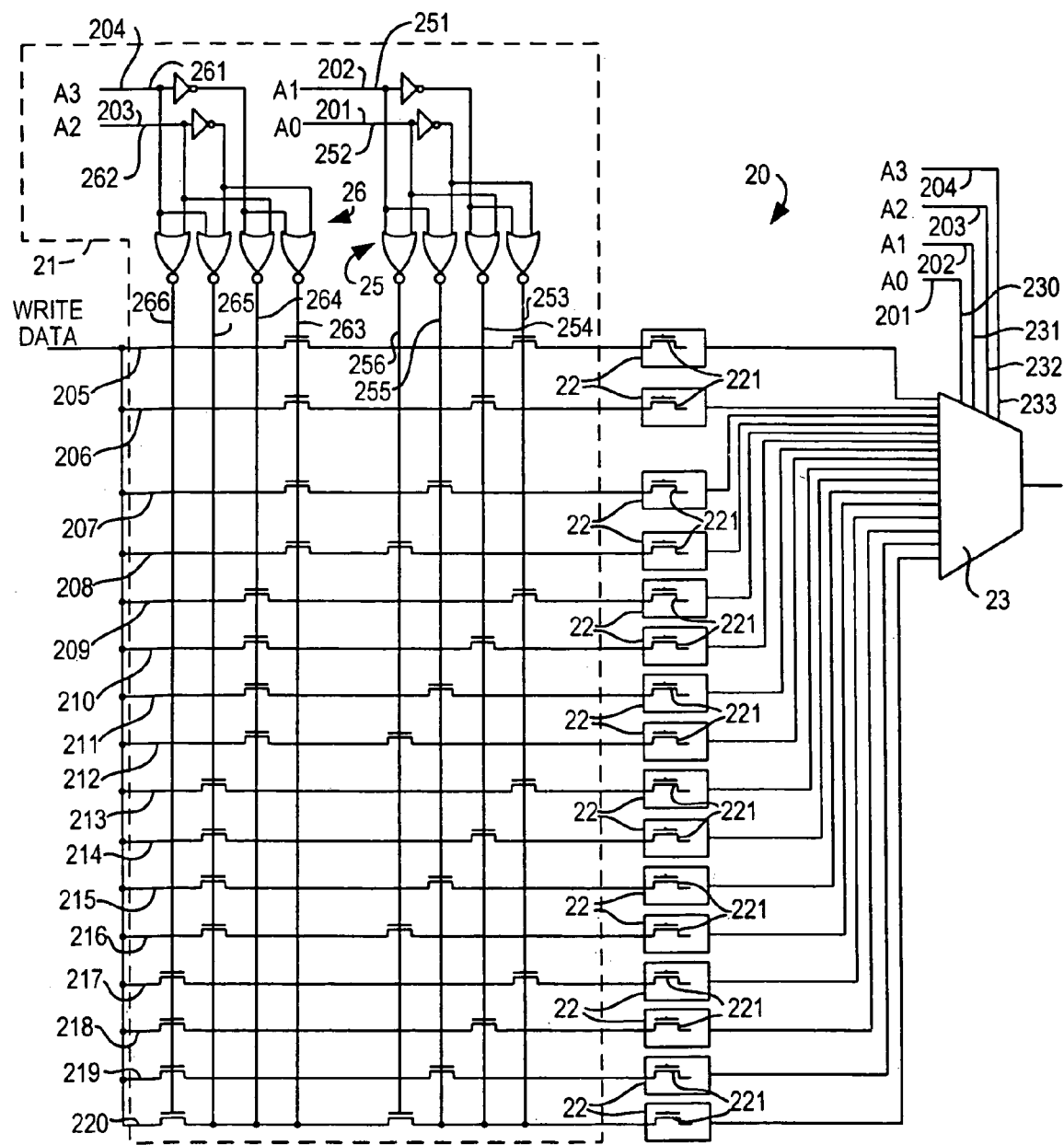
FIG. 2 is a schematic representation of a logic element of a programmable logic device in a previously known distributed RAM configuration.

FIG. 2 shows a known LE configuration 20 including a write address decoder 21 that allows the LE to be used as part of a distributed RAM. In this known configuration, each LE to be made available as part of a distributed RAM is provided with its own write address decoder. LE 20 includes sixteen RAM bits 22, each of which includes a write enable or write access transistor 221. The remainder of the structure of each RAM bit 22—whether in known configuration 20 or in any configuration described below—is not shown as it forms no part of the present invention. RAM bit 22 may use either a single-ended write or a differential write. The relative advantages and disadvantages of each type of RAM cell are well known and may be selected in accordance with the requirements of the device being designed.

For reading purposes, LE 20 includes a 16:1 multiplexer 23 having four select inputs 230-233, connected to the four inputs 201-204 of LE 20. Inputs 201-204 are used as read address inputs in user logic mode or in distributed RAM mode. Inputs 201-204 also may be used as write address inputs in distributed RAM mode, and for that purpose are connected also to write address decoder 21, having least significant bit stage 25 and most significant bit stage 26. Stage 25 decodes two inputs 251, 252 (connected to inputs 203, 204) to select one of conductors 253-256, while stage 26 decodes two inputs 261, 262 (connected to inputs 201, 202) to select one of conductors 263-266. It will be seen that, assuming a write enable transistor (not shown) in each RAM bit 22 is enabled, selecting one of conductors 253-256 and one of conductors 263-266 uniquely enables one the writing of data on one of write data input lines 205-220, providing write data to a respective one of RAM bits 22.

As can be seen, write address decoder 21 consumes four inverters, eight gates, plus three transistors per bit (when write access transistor 221 is included), for a total of eighty-eight transistors. Such a decoder is appropriate when each LE is individually configured as a distributed RAM, but a lower cost per bit can be achieved when a single write address decoder is shared among multiple LEs, by building a full decoder and using fewer write access transistors in each RAM cell.

In accordance with the present invention, write address decoders that can be used to configure multiple LEs as parts of a distributed RAM—e.g., on a LAB-wide basis—are provided on a PLD.

Figure 3:
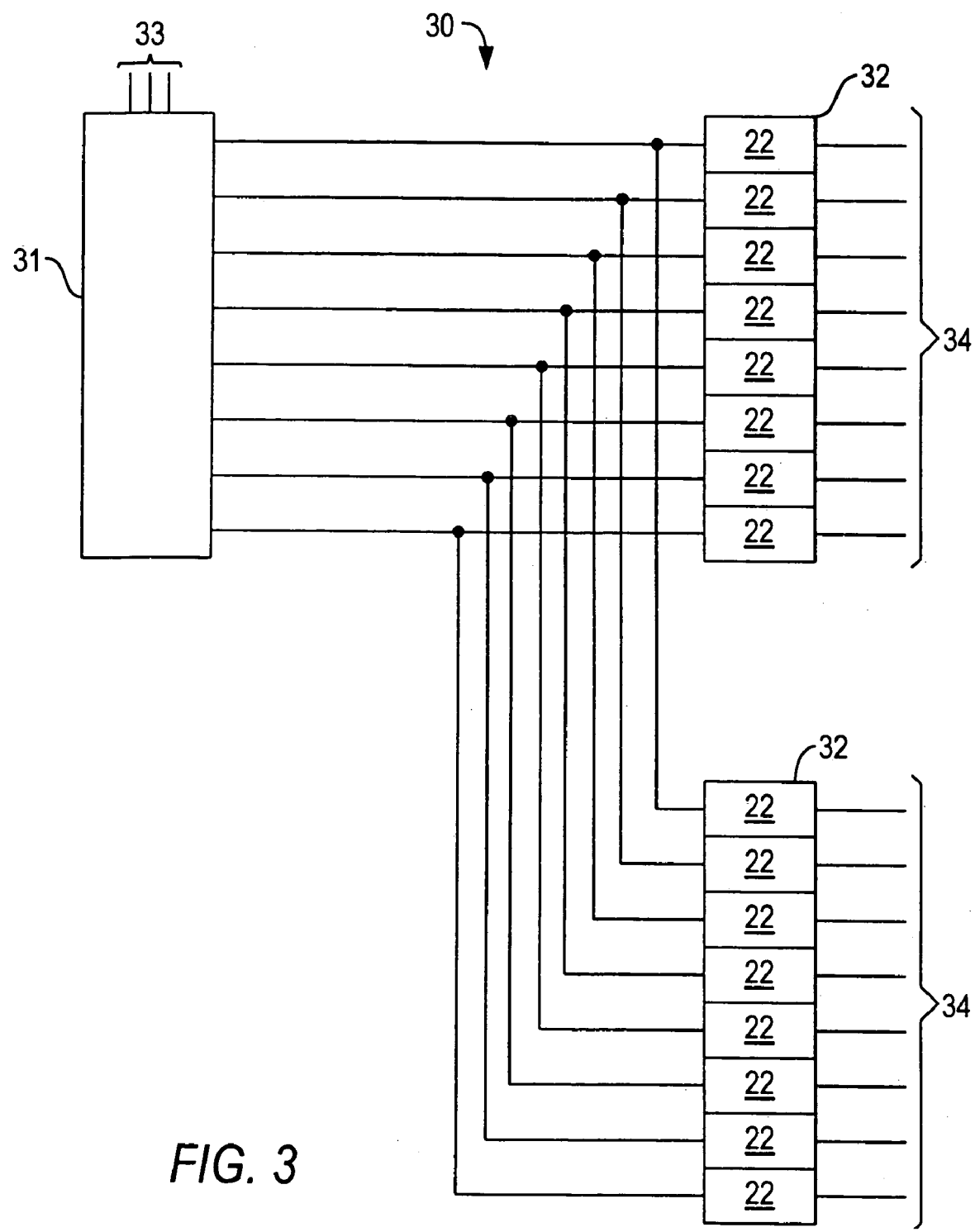
FIG. 3 is a schematic representation of two logic array blocks in a programmable logic device, including a write address decoder in accordance with the present invention.

In a preferred embodiment 30 of the invention as seen in FIG. 3, the write address decoder 31 is made large enough to address individual bits without any additional transistors per bit, and may be connected to any one or more LEs 32. Preferably, each write address decoder is associated with a particular LAB 12, and is connected only to LEs 32 in that LAB 12. However, it is possible to have write address decoder 31 connected to multiple LEs 32 in different LABs 12, as long as they are not too far from write address decoder 31 to slow the signal down unacceptably, and indeed write address decoder 31 is not required to be inside any LAB 12. For example, a write address decoder might be shared among two or more LABs. Similarly, for any LAB 12 in which write address decoder 31 is located, not all LEs 32 necessarily would be connected to write address decoder 31 for use as RAM. Moreover, if any one or more of LEs 32 is large enough, only a fraction of the configuration bits 22 within the LE 32 might be connected to write address decoder 31 to be available for inclusion in distributed RAM.

Thus, write address decoder 31 in embodiment 30 decodes a particular write address based on three address inputs 33, and enables writing to that address (i.e., to that configuration bit) in each LE 32 to which it is connected. As shown in FIG. 3 for illustration purposes only, write address decoder 31 has eight write enable outputs, each of which is connected to a respective bit 22 in each LE 32. Each of the collections of memory cells is provided with a distinct data value which is written into an appropriate cell in each collection in accordance with which cells are write-enabled.

In accordance with the present invention, the data value is generated by a data selection circuit (see below) which can select either configuration data for PLD 10, or user write data. Thus, only a single write data path needs to be provided in each LE to use its configuration RAM for either configuration or user write data, instead of distinct paths as in previously known distributed RAM.

Figure 4:
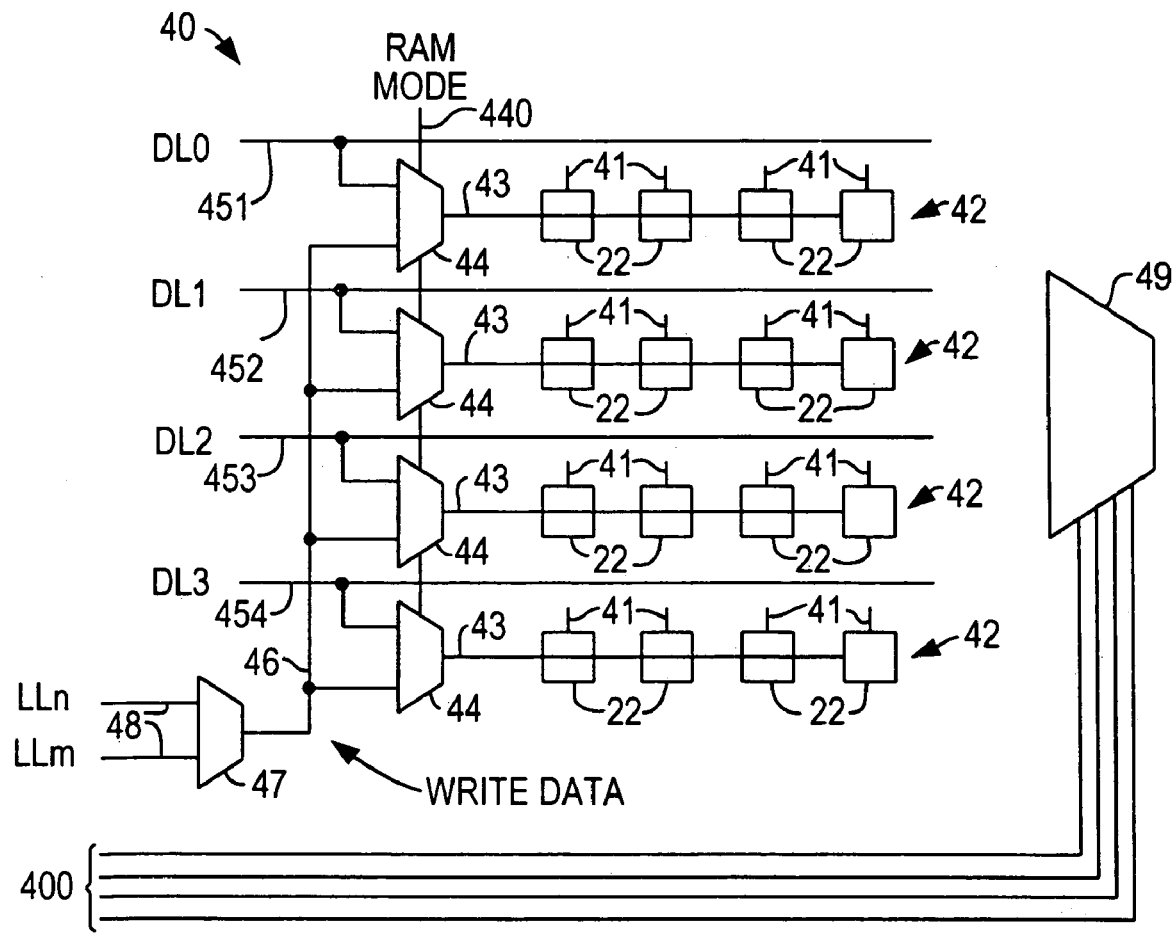
FIG. 4 is a schematic representation of a first preferred implementation of a logic element in a programmable logic device configured in accordance with the present invention.

FIG. 4 shows an LE 40 in which the configuration bits 22 (to be used as part of distributed RAM) preferably are single-ported. Each bit 22 preferably has a respective write enable input 41, while each group 42 of four bits 22 preferably shares a respective data input line 43. A multiplexer 44 on each data input line 43 preferably selects between PLD configuration mode and RAM mode under the control of mode select input 440. The multiplexers 44 collectively constitute the data selection circuit of the preceding paragraph. In PLD configuration mode, write data input lines 43 preferably are connected to respective ones of configuration data lines 451-454, which may come from, and/or continue on to, other LEs 40. A column of four bits 22 preferably is write-enabled and four values from data lines 451-454 preferably are written into respective ones of those bits 22. The values on data lines 451-454 preferably are then changed as the next column of four bits 22 is enabled. The PLD is thereby configured four configuration bits at a time. Because the write decoder and write data path are provided separately from the read path, LE 40 also may be used, if desired, as a dual-port RAM, performing both a read and a write simultaneously.

In RAM mode, write data input lines 43 preferably are connected to write data line 46, which itself preferably is selectably connected by multiplexer 47 to one of preferably two available interconnect lines 48 of LAB 12. Although for logic purposes, it is desirable to have more flexible connections to the interconnect lines, in order to conserve area and resources for implementing the distributed RAM mode, only two (in this example) "LAB lines" are available for write data. This is acceptable because the two LAB lines can be different for each LE in the LAB so that there is a large number of LAB lines available to provide data to the LEs, and because the assignment of a particular column of bits to a particular RAM-slice location is arbitrary and freely permutable, the data lines typically are single fanout and have no fanout-related routing contention. Thus the router is free to allocate each write data inputs to one of a large number of LAB lines, thereby reducing routing stress.

As stated above, multiplexer 49 is used for reading either in user logic mode or distributed user RAM mode, with select lines 400 controlling the bit selection for reading. In contrast to previously known arrangements using a single write decoder, in accordance with the present invention, preferably a low-cost multiplexer is used for the write data, in addition to the usual multiplexers provided for reading, reducing the cost of the distributed RAM.

Figure 5:
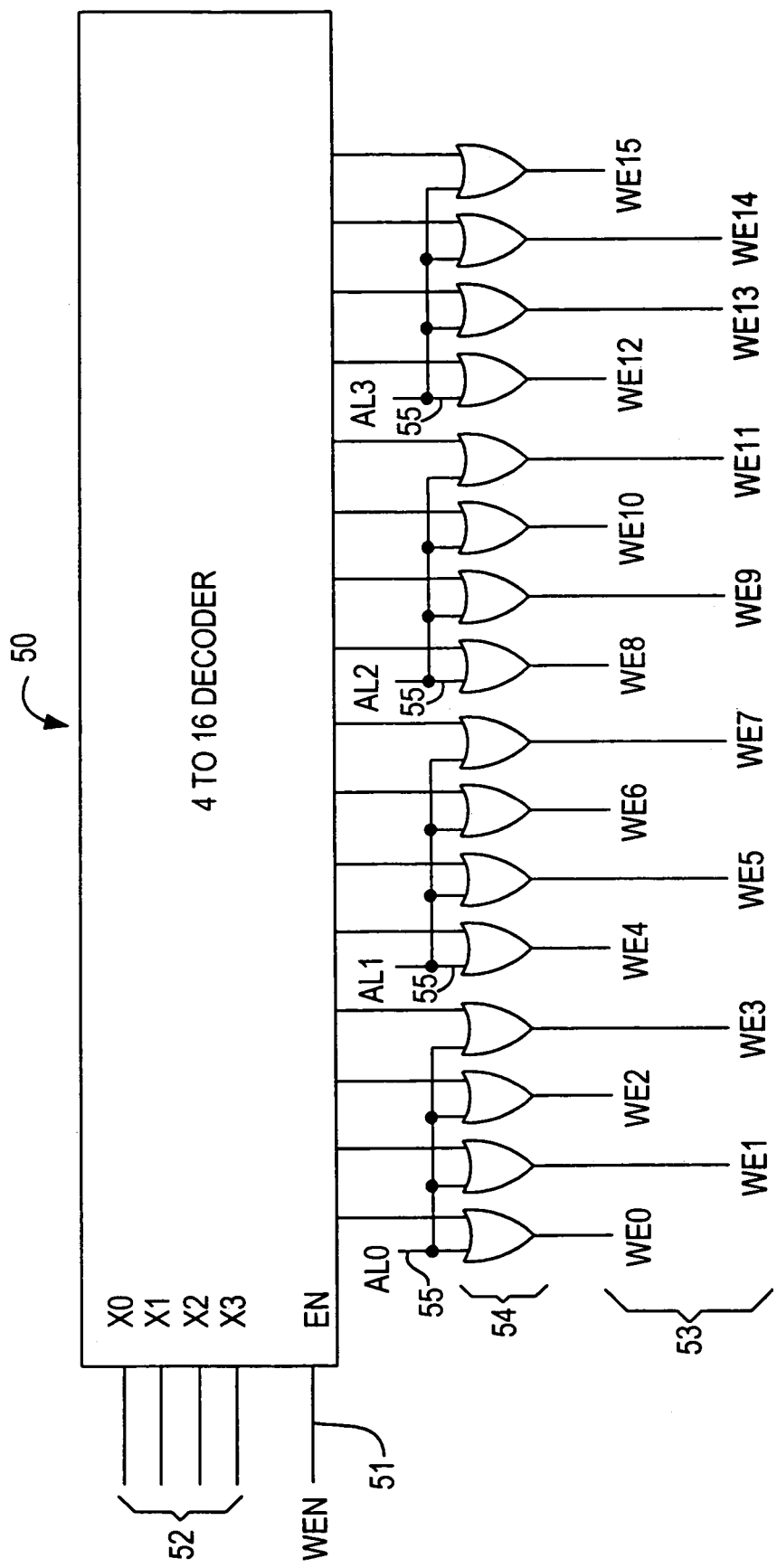
FIG. 5 is a schematic representation of a first preferred embodiment of a write address decoder that may be used in accordance with the present invention.

FIG. 5 shows, schematically, a 4:16 write address decoder 50 that may be used in the present invention. Decoder 50 may be implemented in the secondary signal block available in each LAB in the STRATIX™ or CYCLONE series of PLDs available from Altera Corporation, and use inputs to the secondary signal block as the write decoder inputs. When write-enable input 51 is asserted, the secondary signal block becomes decoder 50, with inputs 52 becoming write address inputs, and outputs 53 becoming RAM-mode write enable outputs. OR gates 54 are provided to OR each RAM-mode write enable output 53 with configuration address inputs 55, to provide write enable inputs 41 to the bits 22 of LE 40 in either configuration mode or RAM mode. Note that OR gates 54 preferably are connected in groups of four to configuration address inputs 55 because configuration bits preferably are written four at a time as discussed above. Other architectures may have different group sizes depending on the addressing of the RAM cells during configuration.

Figure 6:
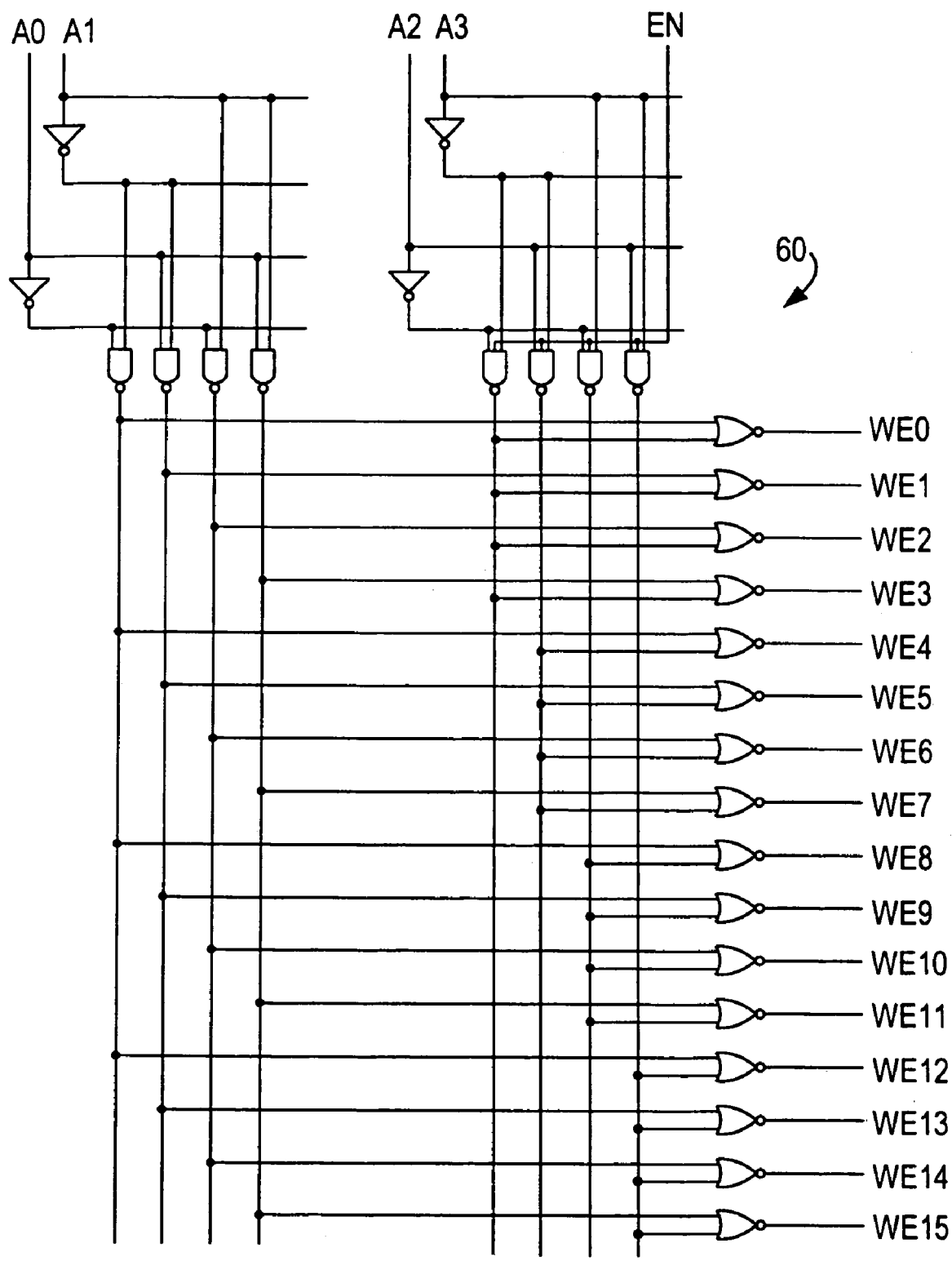
FIG. 6 is a schematic representation of a first preferred implementation of the write address decoder of FIG. 5.
Figure 7:
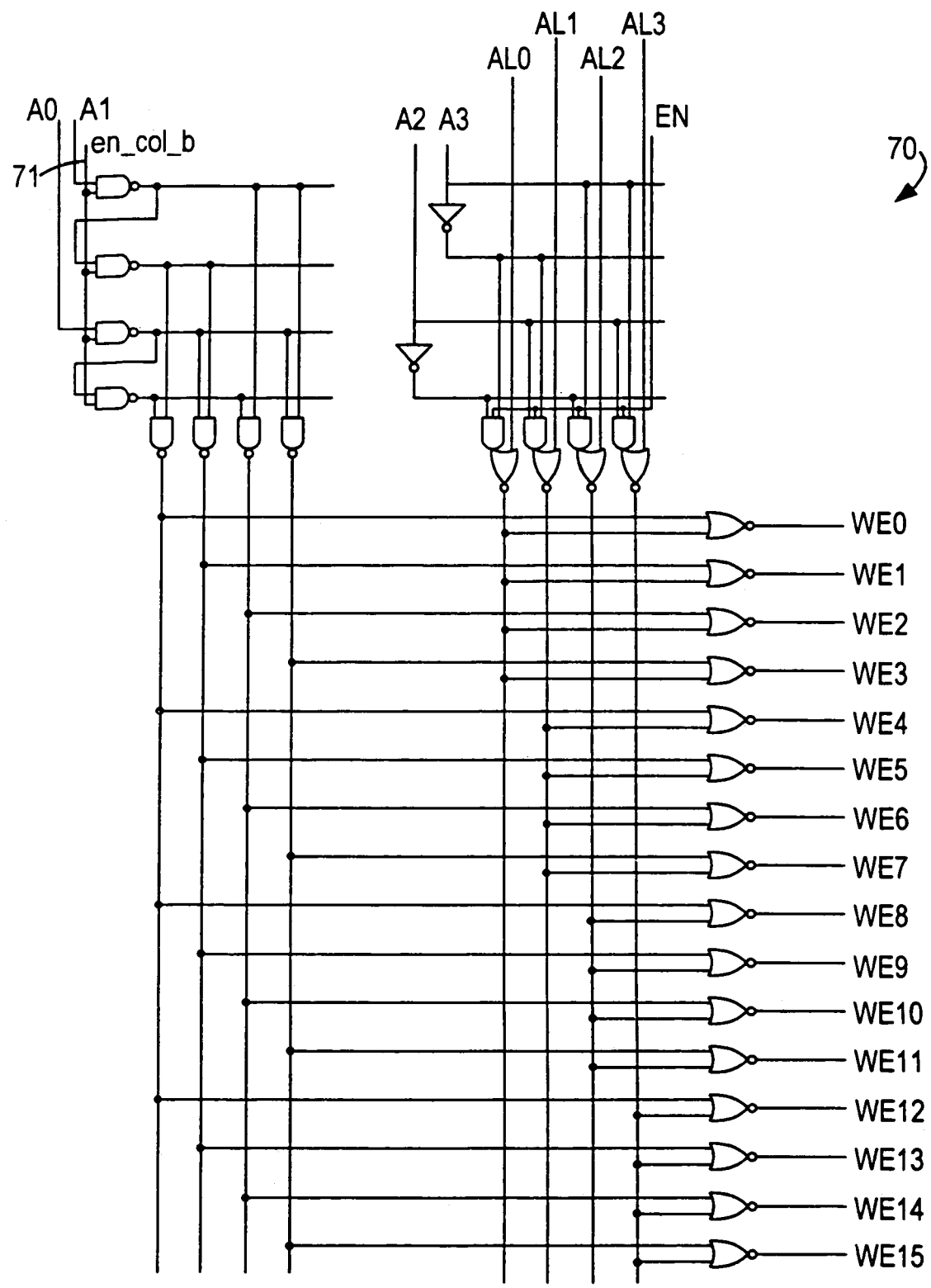
FIG. 7 is a schematic representation of a second preferred implementation of the write address decoder of FIG. 5.

One possible implementation 60 of decoder 50 is shown in FIG. 6. In implementation 60, logic 1 in the enable input EN enables RAM writing. Another possible implementation 70 of decoder 50 is shown in FIG. 7. While implementation 70 requires a second enable input 71 to enable configuration mode, the configuration addresses may be output directly from decoder 70, eliminating the need for sixteen OR gates 54.

Figure 8:
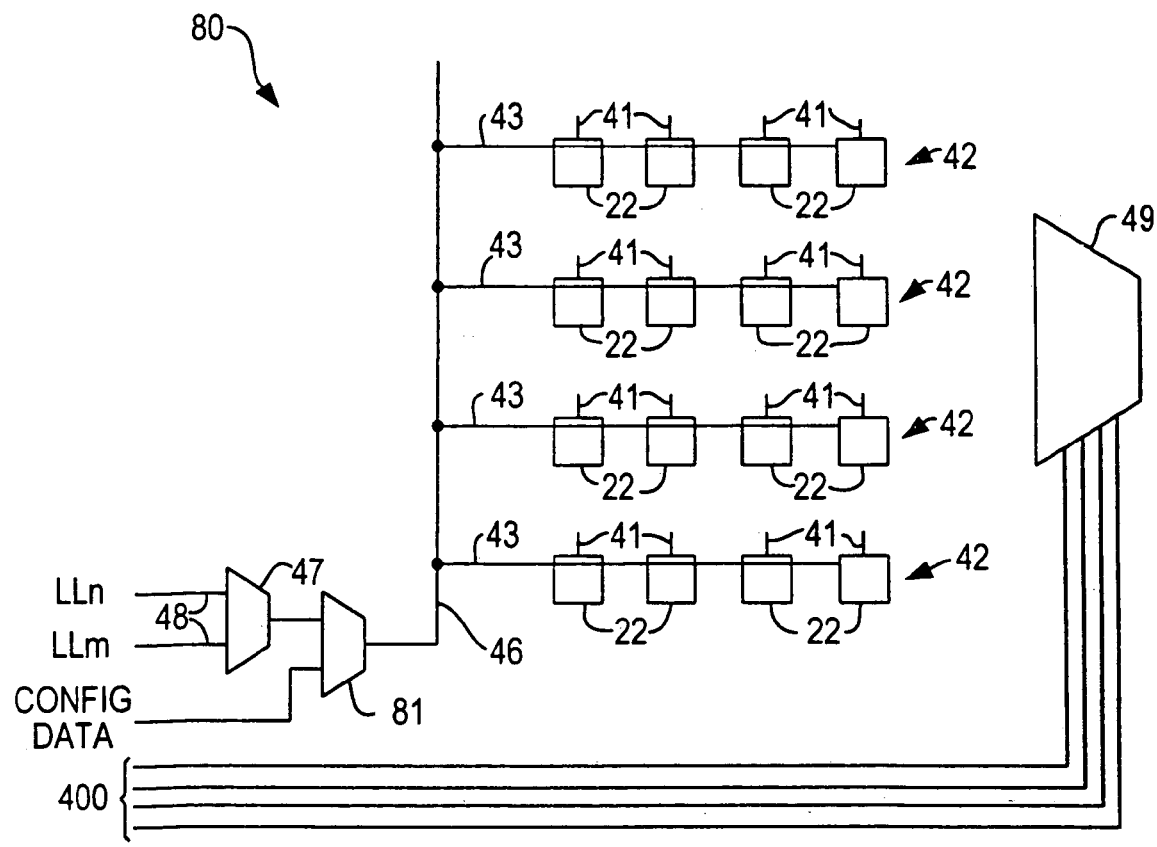
FIG. 8 is a schematic representation of a second preferred implementation of a logic element in a programmable logic device configured in accordance with the present invention.

FIG. 8 shows an alternative implementation of a single-ported single-ended-write LE 80, which is similar to LE 40, except that one multiplexer 81 replaces the four multiplexers 44 for selecting between configuration data in configuration mode and write data in RAM mode. However, in this implementation, the configuration data must be input serially, one bit at a time, so that configuration requires four times as many clock cycles.

Figure 9:
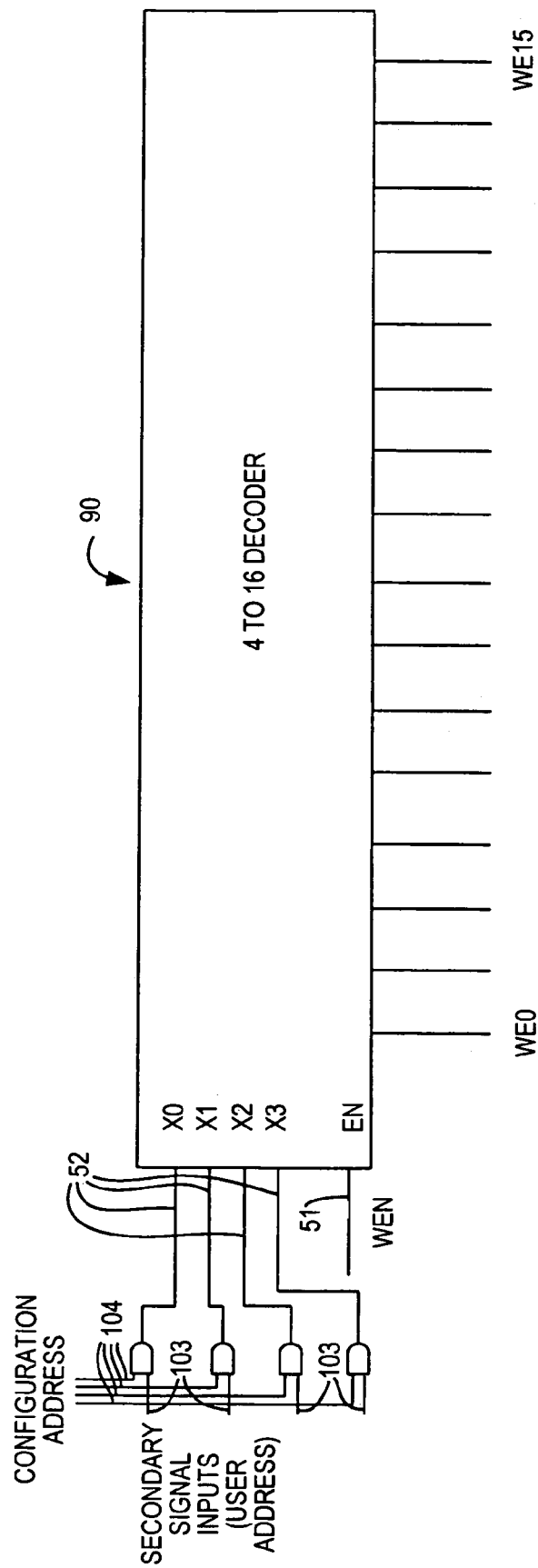
FIG. 9 is a schematic representation of a second preferred embodiment of a write address decoder that may be used in accordance with the present invention.
Figure 10:
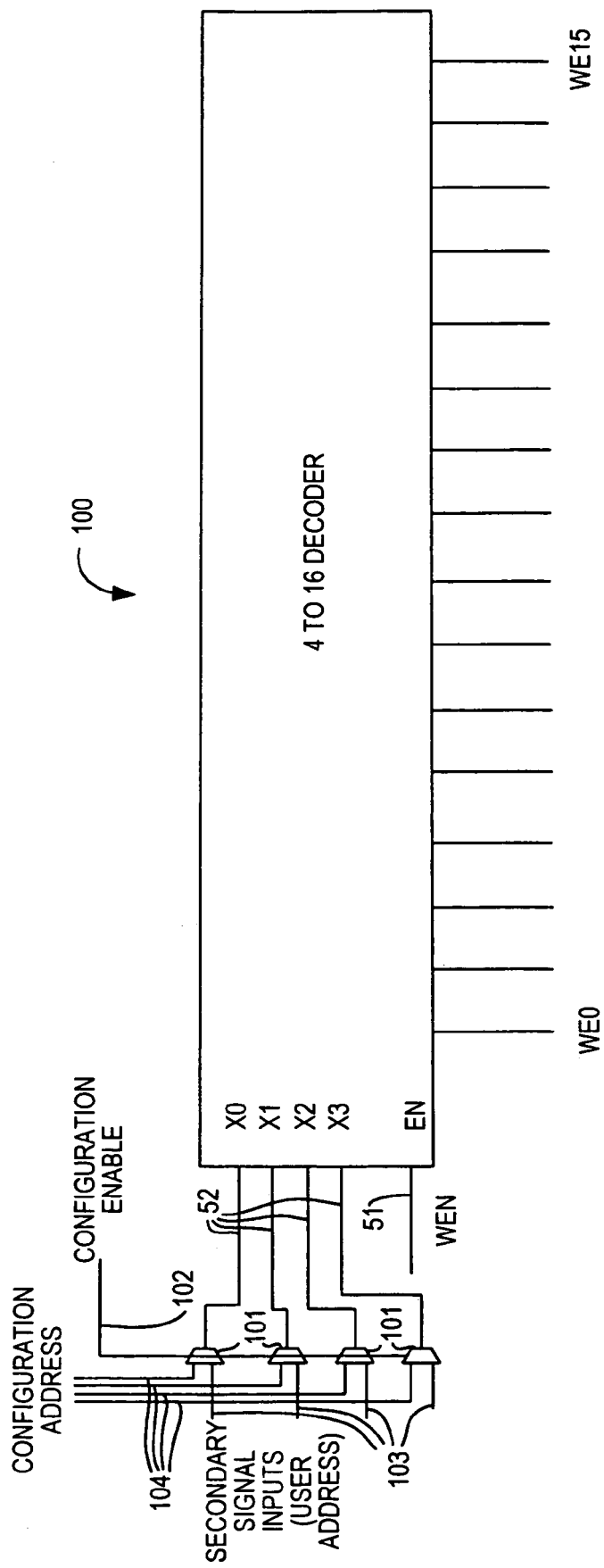
FIG. 10 is a schematic representation of a third preferred embodiment of a write address decoder that may be used in accordance with the present invention.

Ordinarily, during configuration the secondary signal inputs 52 are all in a known state—e.g., logic high (1). FIG. 9 shows an implementation 90 of a write address decoder that takes advantage of this property by inserting AND gates 91 so that the same inputs 52 can be used as configuration address inputs, eliminating the need for separate inputs 55 as well as OR gates 54 of FIG. 5. Write address decoder implementation 100 of FIG. 10 accomplishes the same objective by adding multiplexers 101 using signal 102 to select between secondary signals/user address signals 103 and configuration address signals 104, when signals are not guaranteed to be in a known state.

Figure 11:
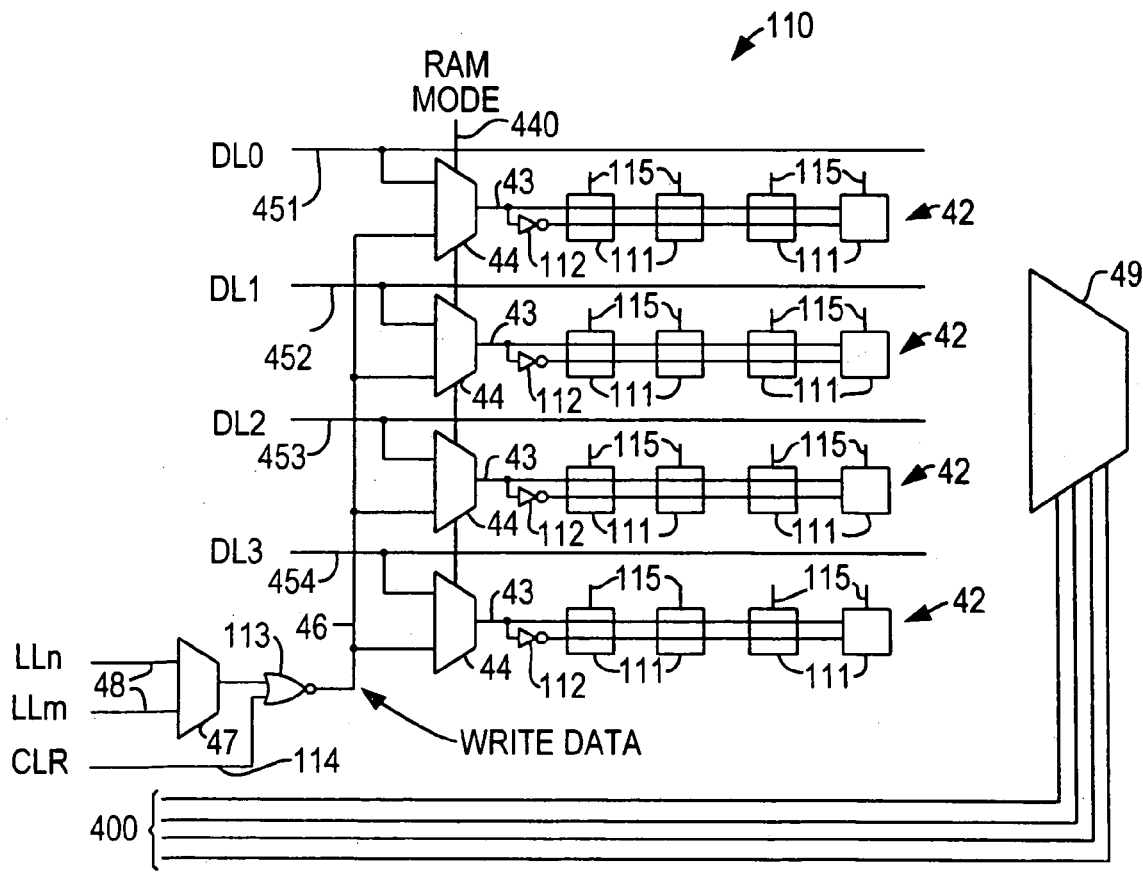
FIG. 11 is a schematic representation of a third preferred implementation of a logic element in a programmable logic device configured in accordance with the present invention.
Figure 12:
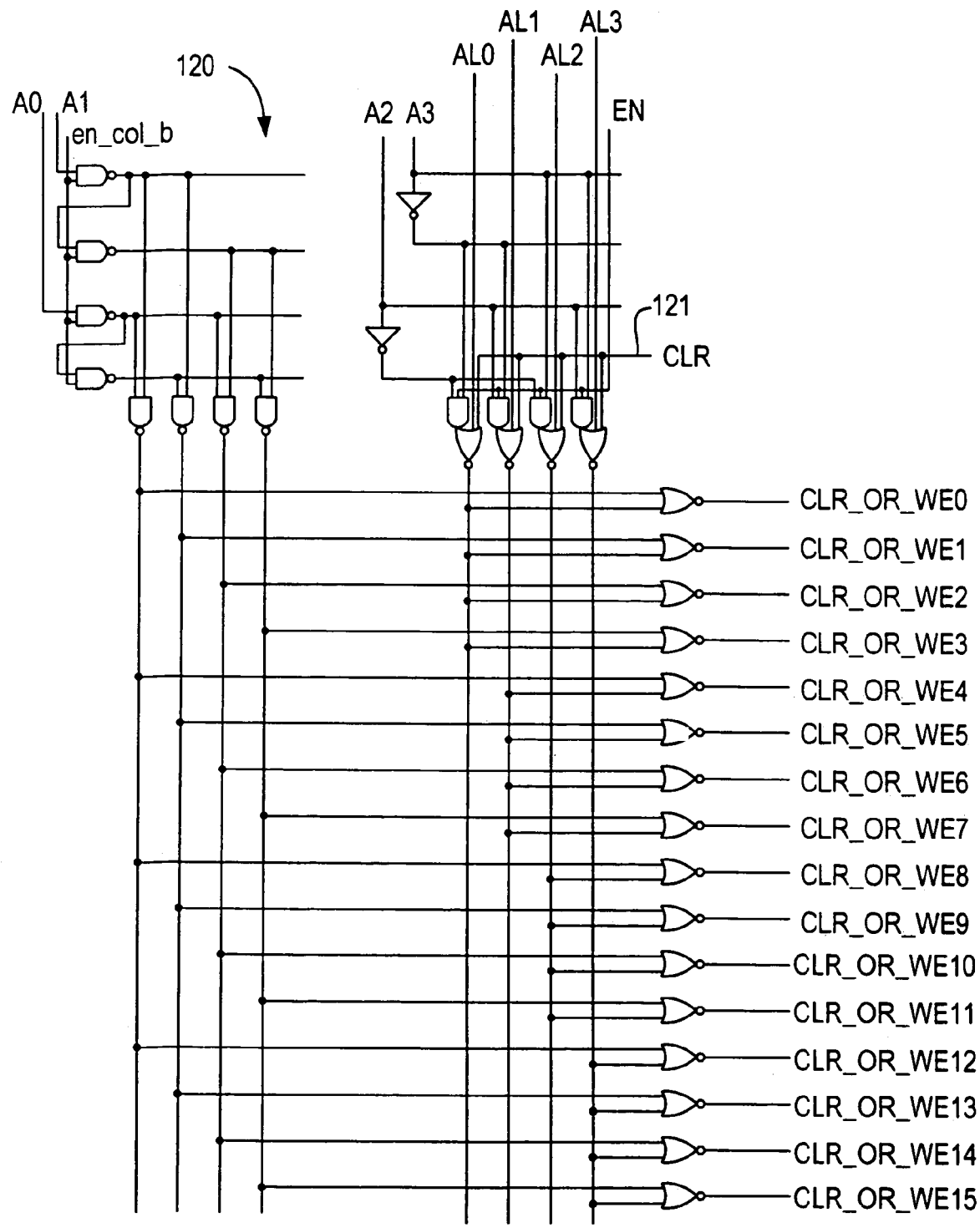
FIG. 12 is a schematic representation of a fourth preferred embodiment of a write address decoder that may be used in accordance with the present invention.

An implementation of LE 110 is shown in FIG. 11. This is similar to LE 40 except that the bits 111 are written differentially. Therefore, inverters 112 are added. Alternatively, differential data may be supplied, in which case additional multiplexers (not shown) may be provided to supply differential data to the bits 111. In addition, NOR gate 113 is provided to allow input of a CLEAR signal 114, and write-enable inputs 115 are also used as CLEAR inputs when CLEAR signal 114 is asserted. A decoder 120 for use with LE 110 is shown in FIG. 12, and is similar to decoder 70 of FIG. 7 except for the addition of CLEAR input 121.

Figure 13:
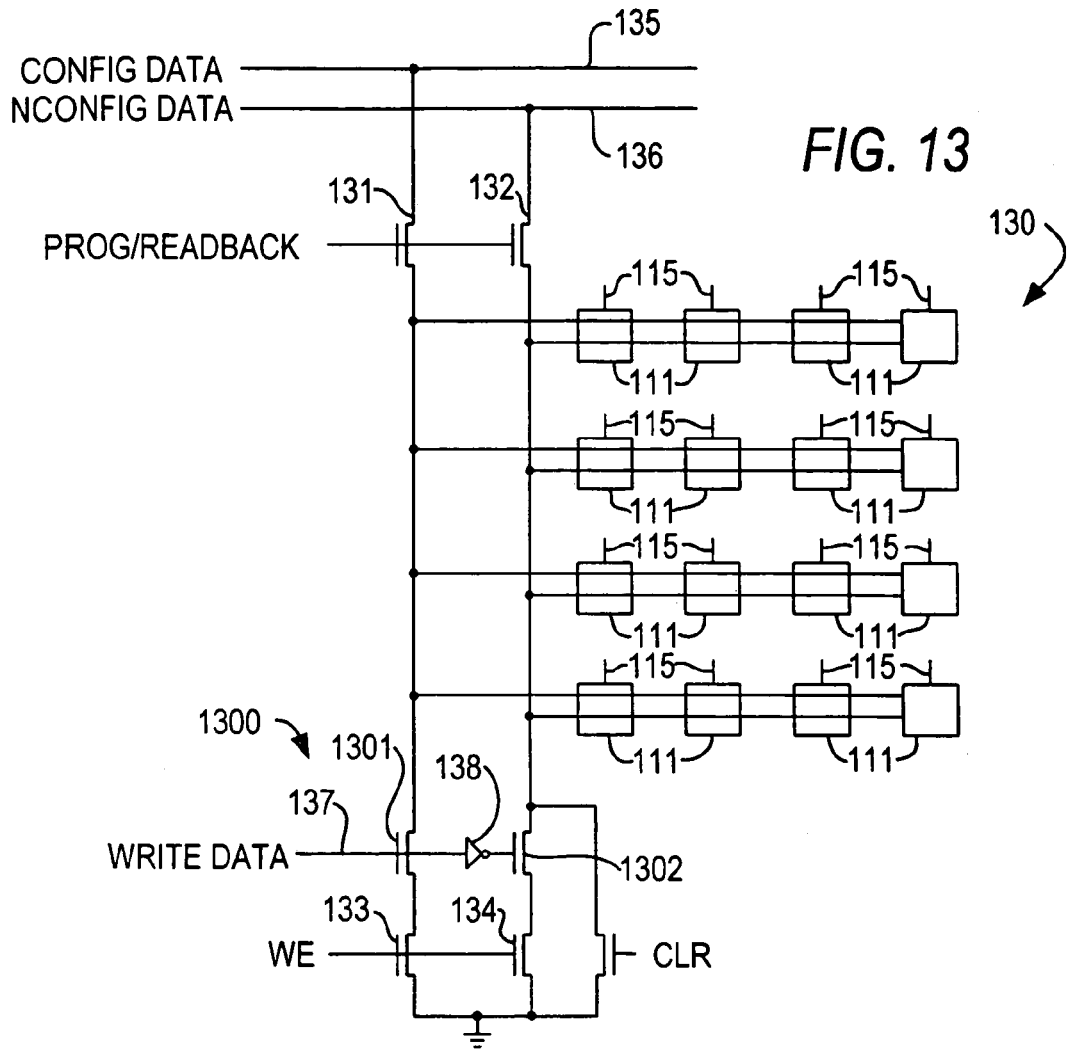
FIG. 13 is a schematic representation of a differential logic element as in FIG. 11, with a single write/configuration data multiplexer as in FIG. 8 decomposed into individual transistors.

An LE 130, similar to LE 110 in that the bits are written differentially, but with a single write/configuration data multiplexer such as multiplexer 47 of FIG. 8, decomposed into individual transistors 131-134, is shown in FIG. 13. However, in this embodiment, inverters 111 are not needed as in FIG. 11, because the true and complement configuration data are provided on separate respective lines 135, 136, while the write data 137 are complemented by inverter 138. Because transistors 131-134 are bidirectional, so the multiplexer they form, allowing programming data to be read back through transistors 131, 132 to verify the programming.

Figure 14:
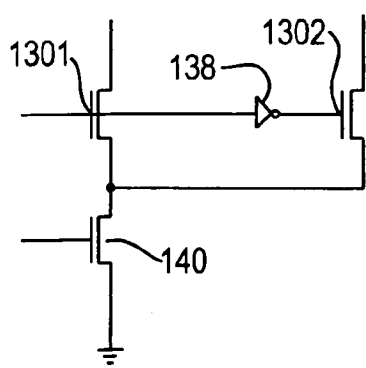
FIG. 14 is a schematic representation of an alternative embodiment of a portion of the logic element of FIG. 13.
Figure 15:
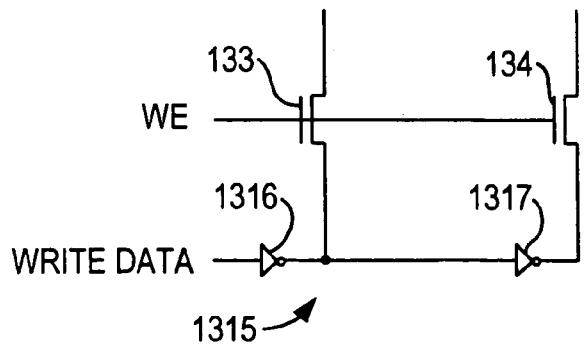
FIG. 15 is a schematic representation of another alternative embodiment of a portion of the logic element of FIG. 13.

Transistors 1301, 1302, together with inverter 138, form the write driver 1300 for LE 130. As shown, write driver 1300 separates transistors 133, 134 of the write multiplexer from transistors 135, 136 of the write multiplexer. This is not necessary, and the "stack order" of the write driver and the multiplexer transistors 133, 134 can be arranged as desired. One reason for the arrangement of FIG. 13 is shown in FIG. 14, where transistors 133, 134 are collapsed into a single transistor 140. On the other hand, a reason to reverse the arrangement is shown in FIG. 15, where write driver 1300 is replaced by write driver 1315, comprising two inverters 1316, 1317. Because the inverters always drive a logic value, either 0 or 1, on their outputs, it is necessary to use pass transistors 133 and 134 to isolate the driver from the RAM cells when configuration or readback is being performed.

Figure 16:
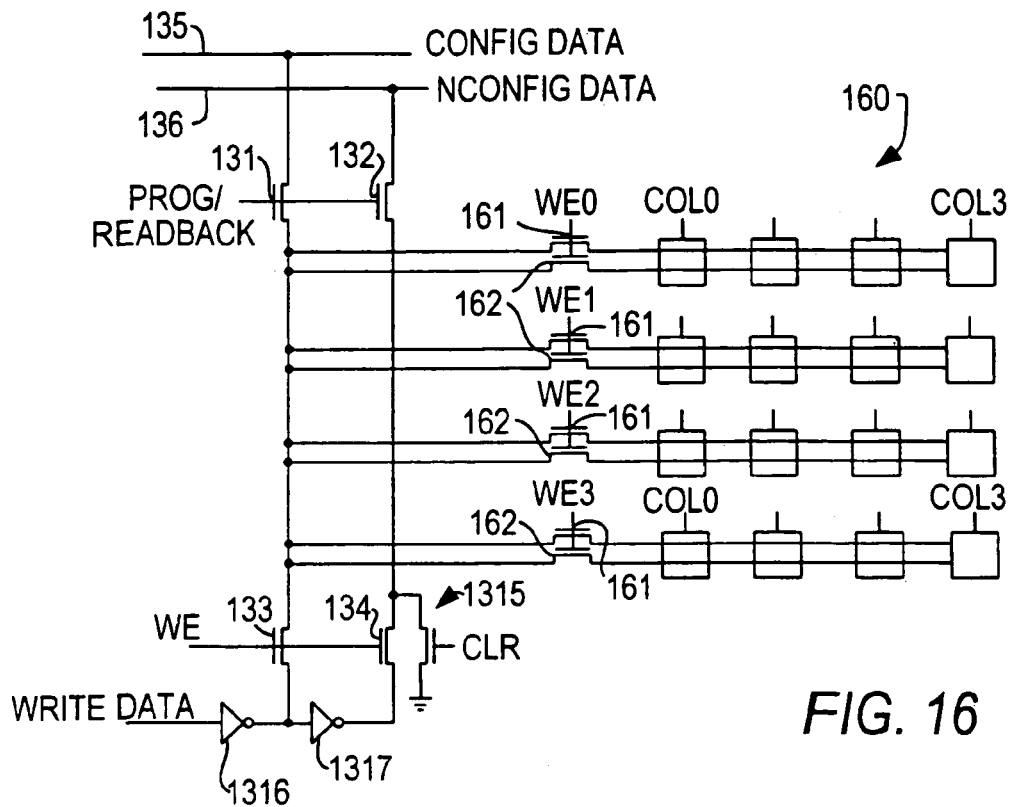
FIG. 16 is a schematic representation of a differential logic element configured for separate row and column addressing.
Figure 17:
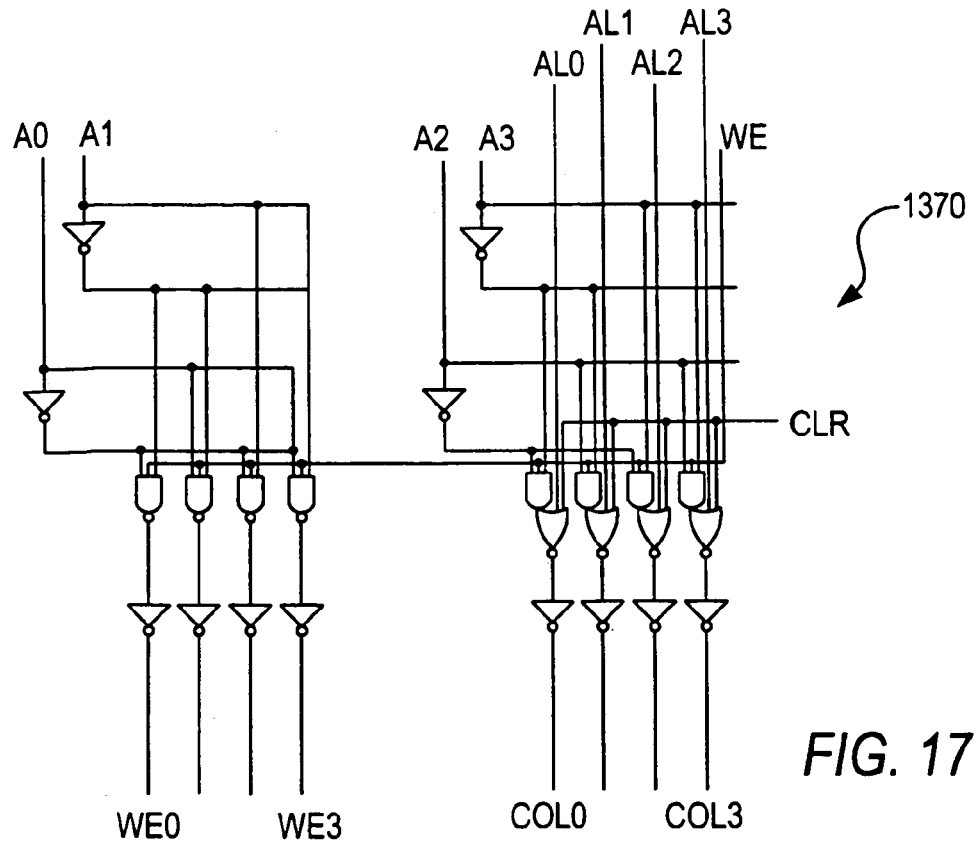
FIG. 17 is a schematic representation of a decoder for generating separate row and column address signals.
Figure 18:
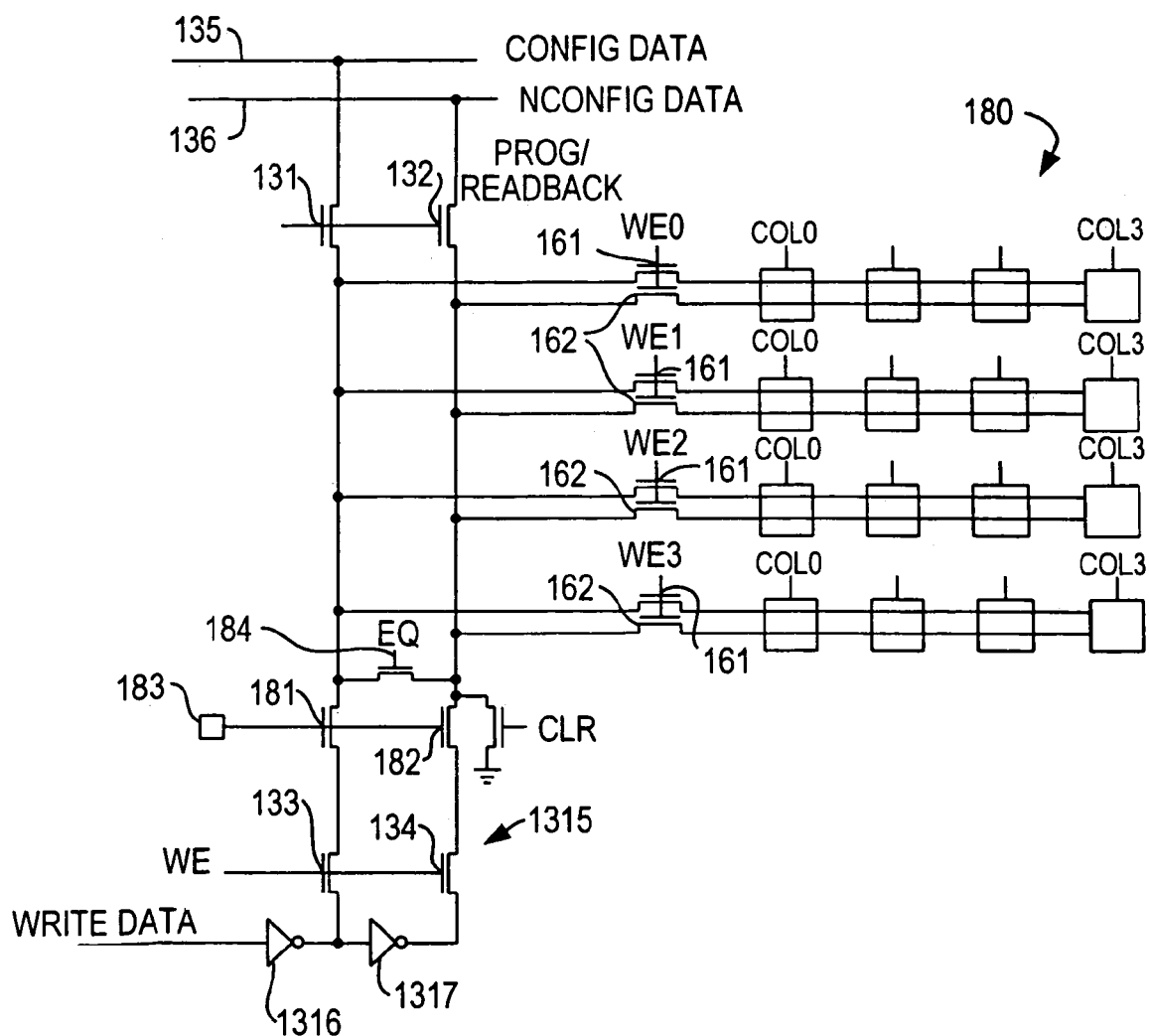
FIG. 18 is a schematic representation of a logic element as in FIG. 16, modified to allow control of inclusion in distributed RAM.

An LE 160 with row-column access and a differential RAM cell is shown in FIG. 16. Here, separate row and column addresses are provided by decoder 170 of FIG. 17, while two additional transistors 161-162 (one for the single-ended case) are required to multiplex write and configuration data for each row. Although more multiplexer transistors are required than in LE 130, one decoder layer can be omitted from decoder 170 as compared to the decoders described above. This structure also has the advantage that only eight wires are required (four row wires and four column wires) to connect the write decoder to the LE, reducing the amount of wiring required. A further advantage is that less capacitance is connected to each RAM cell, which is useful in avoiding upsets to the cell during readback, or when a mix of logic and distributed RAM is used, as described below.

A mix of logic and distributed RAM can be included in each LAB by providing distinct write enable circuitry for the write driver. This is shown in LE 180 of FIG. 18, which is similar to LE 160. By providing transistors 181, 182 in the write driver for each LE, the write signal for individual LEs can be gated—e.g., by configuration RAM 183, or by a signal from the user logic (not shown)—allowing user control over whether or not this particular LE is included in distributed RAM. Thus, even if some LEs in a particular LAB are included in distributed RAM, individual LEs can be excluded from the distributed RAM and used as logic. In this arrangement it is advantageous to use the row-column access method described in FIG. 17 to reduce the capacitance associated with each row of RAM, and to introduce a precharge transistor and/or equilibration transistor 184 to avoid RAM upset while allowing a high speed write access.

Figure 19:
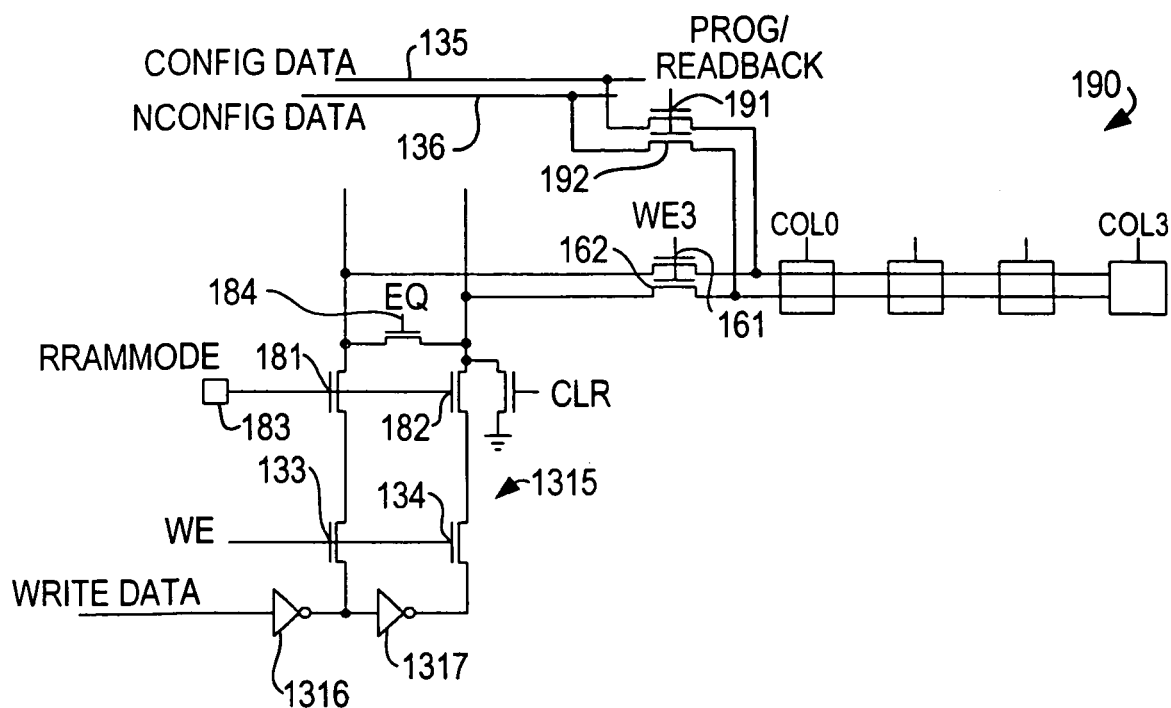
FIG. 19 is a schematic representation of a variation of the logic element in FIG. 18 for row-parallel programming.

If it is desired to use a configuration method that accesses one bit in each row of the RAM for each LE concurrently, the circuit of FIG. 19 can be used. FIG. 19 shows one row of an LE 190 similar to LE 160, but with further additional transistors 191, 192 per row (one per row in the single-ended case). As in LE 180, transistors 181, 182 gated by a configuration RAM 182 or by user logic, is provided to determine whether or not user RAM will be available on a per-LE basis.

Figure 20:
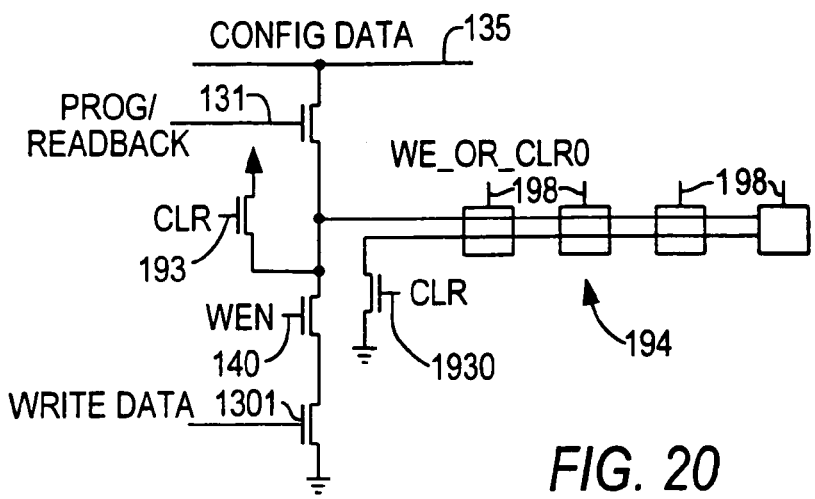
FIG. 20 is a schematic representation of a collection of cells using a common clear to write all cells.

As an alternative to the write drivers described above, advantage may be taken of a common transistor for setting a collection of cells to a known state, such as logic 0—e.g., a CLEAR transistor 193 of LE 194, shown partially in FIG. 20—to write the opposite state, such as logic 1, into those cells. To write into this circuit, the WE_OR_CLR signal 198 for a given cell is asserted, and the CLR signal is asserted briefly, causing the selected cell to reset to the 0 state. After a short time, preferably determined by a self-timed pulse generator, the CLR signal is negated and the WE signal in the LE is asserted, causing the selected cell to be set to a 1 if the data is 1, and left unchanged at 0 if the data is 0.

Figure 21:
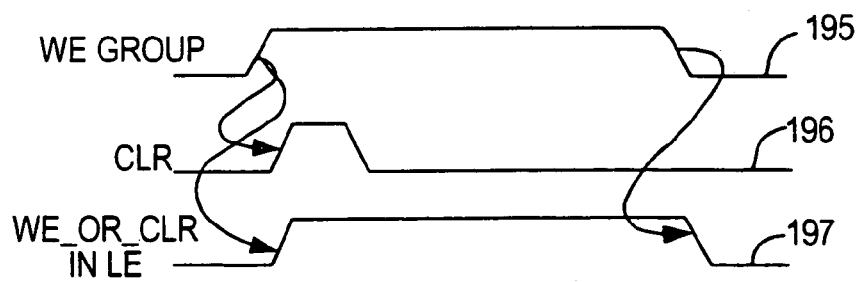
FIG. 21 is a timing diagram showing the operation of the cells of FIG. 20.

The timing of the write sequence is shown in FIG. 21. First, the group write enable 140 is asserted as at 195. This causes clear 193 and per-cell write-enable 198 to be asserted as at 196 and 197. If the data are a 1, the state of the cell will change as a 0 is driven on the complementary line; otherwise the cell remains unchanged. As stated above, a self-timed circuit preferably generates the necessary sequence of pulses.

Alternatively, a distinct clear signal for each cell may be provided using transistor 1930.

Figure 22:
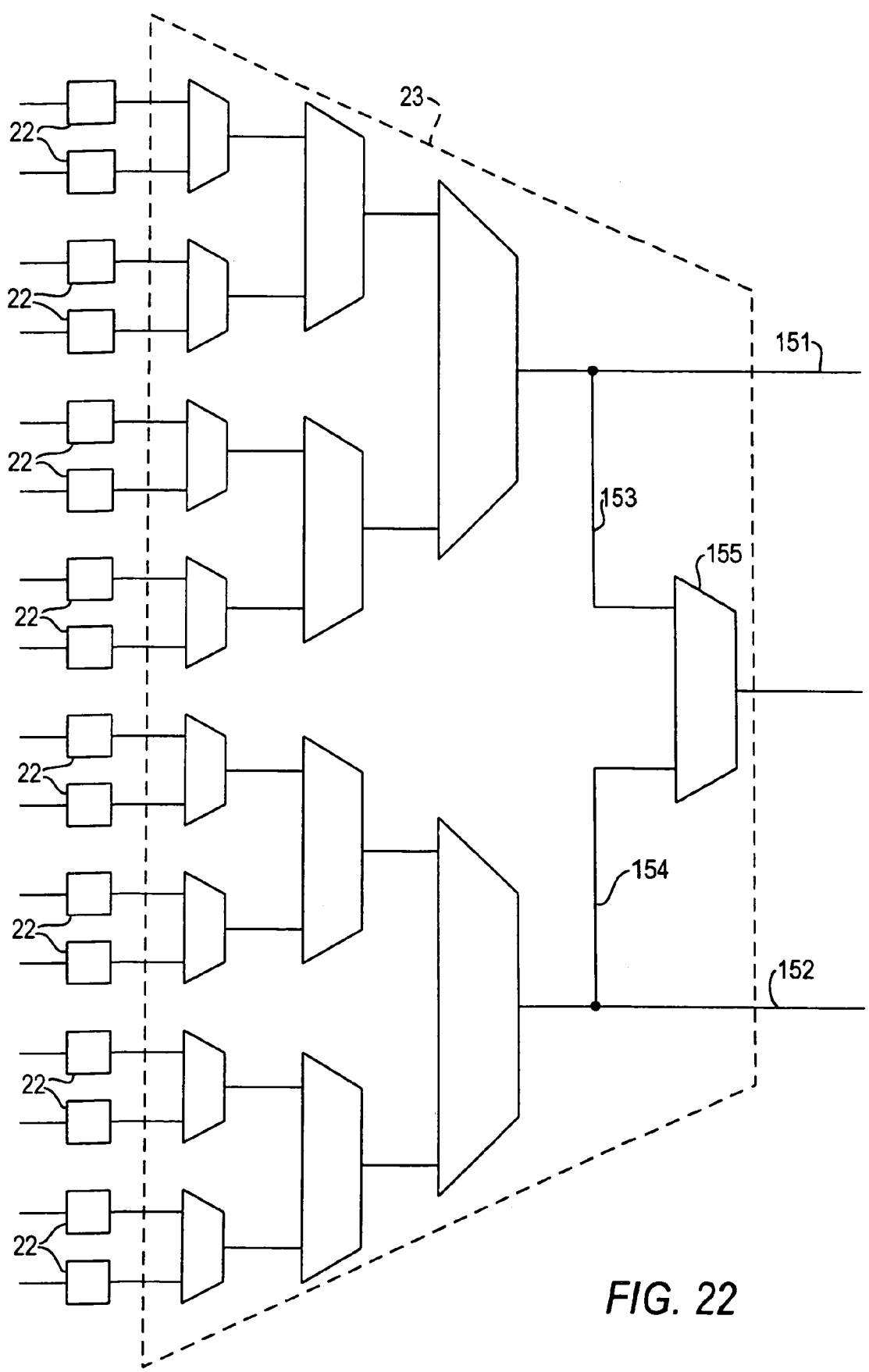
FIG. 22 is a schematic representation of a modification to create a two-bit-wide RAM.

The embodiments described above are based on a four-input look-up table, providing $2^4=16$ bits. However, the invention is equally applicable to larger look-up tables, such as five-input look-up tables or six-input look-up tables, providing $2^5=32$ or $2^6=64$ bits, respectively. Moreover, the invention has been described so far only in the context of 1-bit wide distributed RAM. It is possible, as shown in FIG. 22, by tapping, as outputs 151, 152, the inputs 153, 154 of the final 2:1 stage 155 of multiplexer 23 to create 2-bit wide distributed RAM. This is particularly the case with larger look-up tables, as the final multiplexer stage frequently is tapped in the case of shared LUT mask look-up tables. Thus, a six-input look-up table may be configured as a 64×1 bit RAM or as a 32×2 bit RAM. Another possibility with larger look-up tables that can have more than one output is that one can use a portion of the configuration RAM bits in the look-up table as distributed user RAM, while the remainder of the configuration RAM bits are used for user logic in the usual way.

Many LEs include flip-flops to provide registered outputs from the look-up table. These flip-flops may be configured in accordance with the present invention to provide input registers and/or output registers, to the extent allowed by the programmable connectivity of the flip-flops.

As stated above, any or all of the LEs on a PLD may be included in the distributed RAM in accordance with the present invention. The advantage of the invention arises from having one write address decoder for more than one LE, and sharing the write data path between both configuration data and user RAM data. Although it is preferred that there be one write address decoder per LAB, it is within the invention to have more or fewer than one write address decoder per LAB. One possible variation is having one decoder per LAB, but not in every LAB of the PLD. Another possible variation is having, for every LAB that has a write address decoder, only some LEs of that LAB connected to the write address decoder. Still another possible variation is having, within some or all LABs, a plurality of write address decoders, each connected to a fraction of the LEs in the LAB (with the possibility that either some LEs in a particular LAB are not connected to any write address decoder, or that each LE in that particular LAB is connected to one of the write address decoders). In yet another possible variation, the write address decoder can be part of the PLD, and connected to two or more LEs (in the same or different LABs), but not be part of any particular LAB. In yet a further possible variation, the inputs to one or more write decoders are taken from more than one LAB, to avoid using many or all of the available secondary signals in a LAB that is being used as distributed RAM.

Distributed RAMs implemented in accordance with the present invention preferably operate asynchronously. This means that it may be desirable to provide, within each write address decoder, write address latches as well as a write pulse generator that generates a synchronous write pulse of suitable delay and width to allow a synchronous write operation. In addition, a flip-flop in each LE (see above) may be used as a write data latch to enhance data stability with respect to the write pulse.

Because a PLD that includes one or more write address decoders in accordance with the present invention allows individual configuration RAM bits to be accessed during user mode, the present invention also allows the user to rewrite the user logic configuration during operation, either by direct input or as the result of logic operations. The user would configure as distributed RAM any configuration bits that might be rewritten, but would use them essentially as ROM for logic operations. However, because they are configured as RAM, those bits can be rewritten during operation.

Figure 23:
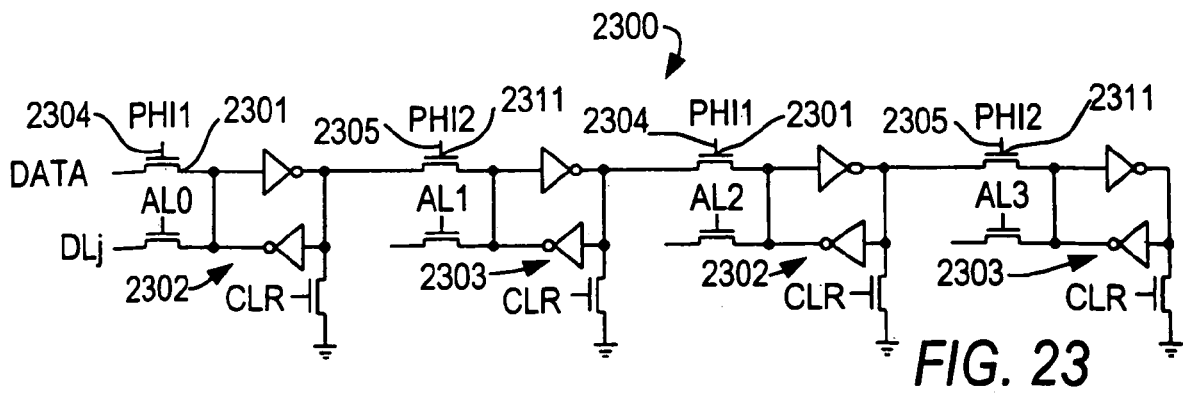
FIG. 23 is a schematic representation of a first embodiment of a shift register in accordance with the present invention.

Another known way to use configuration RAM bits of a PLD as memory is to chain them together as shift register. It is known to add transistors to configuration RAM bits to allow formation of the two latches needed for each bit of a shift register. In accordance with the present invention, as shown in FIG. 23, a pass transistor 2301, 2311 preferably is added between each configuration RAM bit 2302, 2303, to create a chain 2300. Every other one of pass transistors 2301, 2311 is connected to one of two clocks 2304, 2305 that are 180° out of phase with one another. In this way, each pair 2302, 2303 of adjacent configuration RAM bits forms one shift register stage, with the data in each configuration RAM bit 2303 representing the data in each stage.

It can be seen from FIG. 23 that on the relevant transition (e.g., rising edge) of clock 2304, each pass transistor 2301 conducts, so that the data in each configuration RAM bit 2302 (or coming from an external source in the case of the first shift register stage) is transferred to configuration RAM bit 2303 of the next stage. That data does not propagate to configuration RAM bit 2302 of the next stage because pass transistor 2311, clocked by clock 2305, is not conducting. On the following transition of clock 2305, each pass transistor 2311 conducts, so that data propagates from the configuration RAM bit 2302 of each stage to configuration RAM bit 2303 of that stage, but not to the next stage because pass transistor 2301, clocked by clock 2304, is not conducting.

In such an arrangement as is shown in FIG. 23, twice as many configuration RAM bits are used to form a shift register of a given length, as compared to previously known arrangements. However, fewer additional transistors are necessary than in those known arrangements.

It should be noted that while RAM bits 2302, 2303 are shown as a known type of single-port single-ended RAM bit including two inverters and associated transistors, any type of RAM bit may used in accordance with this invention, including both single-port and dual-port RAM bits and both single-ended and differential RAM bits.

However, because NMOS transistors pull weakly to a logic 1, it may not be efficient to use a single-ended write. Thus, in one alternative 2400, shown in FIG. 24, a differential write is used. It is necessary to have each configuration RAM bit 2402, 2403 drive the gates of the shift transistors 2404, 2405, because otherwise symmetry makes the shift direction undefined. The two out-of-phase clocks 2304, 2305 are connected as shown to respective shift transistor pairs. However, instead of having alternating bits clocked by the alternating ones of clocks 2304, 2305 as in FIG. 23, two consecutive pairs of shift transistor pairs (each in a different stage) are clocked by the same clock 2304, and then the next two consecutive pairs of shift transistor pairs (each in a different stage) are clocked by the same clock 2305, and so on.

Figure 24:
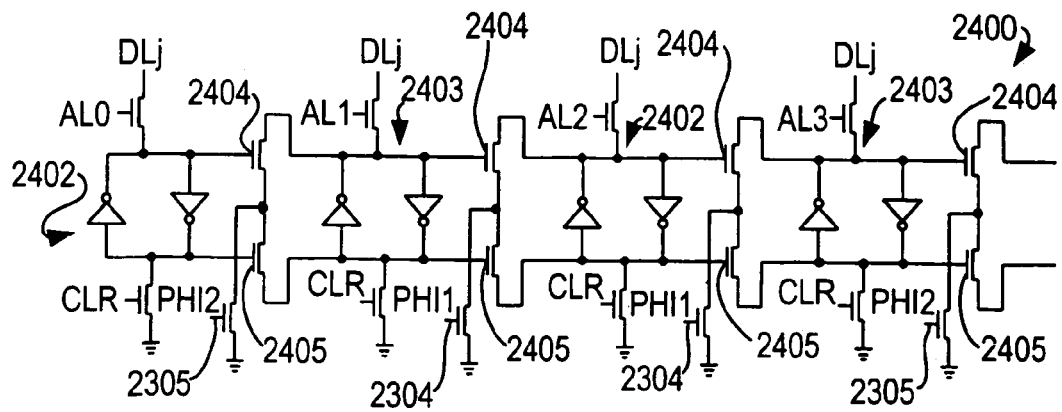
FIG. 24 is a schematic representation of a second embodiment of a shift register in accordance with the present invention.
Figure 25:
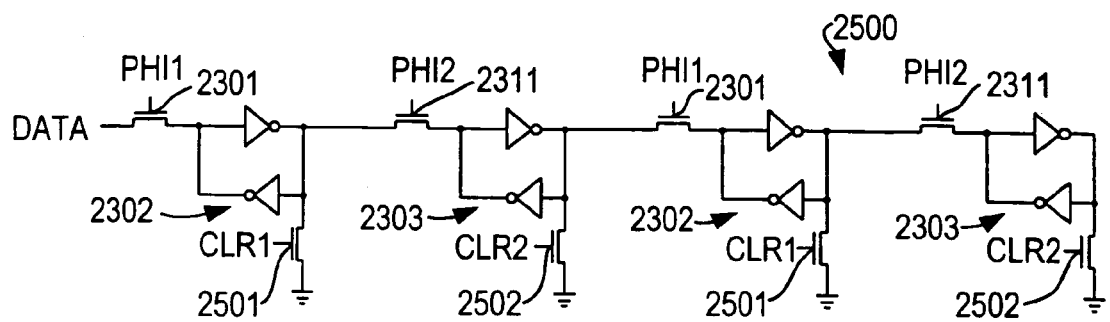
FIG. 25 is a schematic representation of a third embodiment of a shift register in accordance with the present invention.
Figure 26:
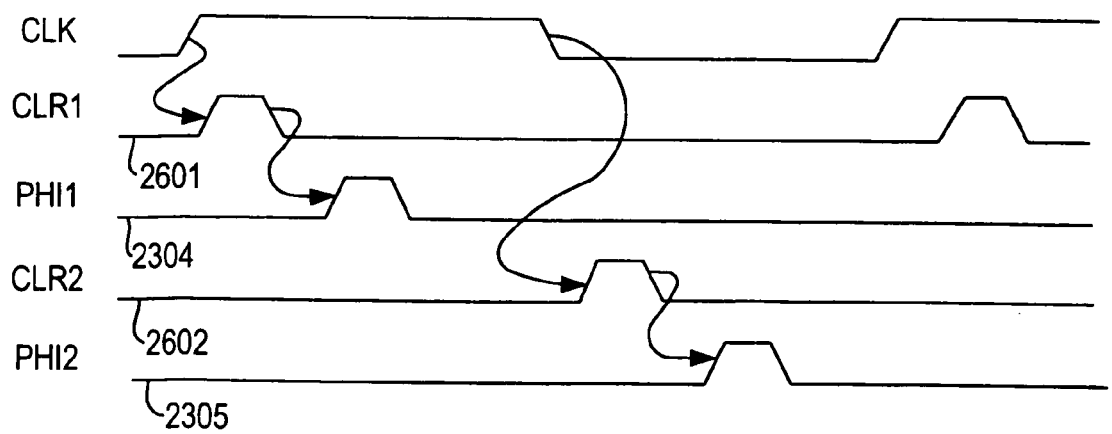
FIG. 26 is a timing diagram of the operation of the shift register of FIG. 25.

To avoid the three extra transistors per bit (six per shift register stage) of FIG. 24, a very simple arrangement 2500 shown in FIG. 25 is similar to chain 2300. Instead of the additional transistors of FIG. 24, every other clear transistor 2501, 2502 is pulsed with a respective clear signal 2601, 2602, as shown in FIG. 26, in addition to the clocking of transistors 2301, 2311 by clocks 2304, 2305.

Thus it is seen that the present invention allows economical reuse of unused PLD configuration RAM bits as distributed user RAM or shift register memory.

Figure 27:
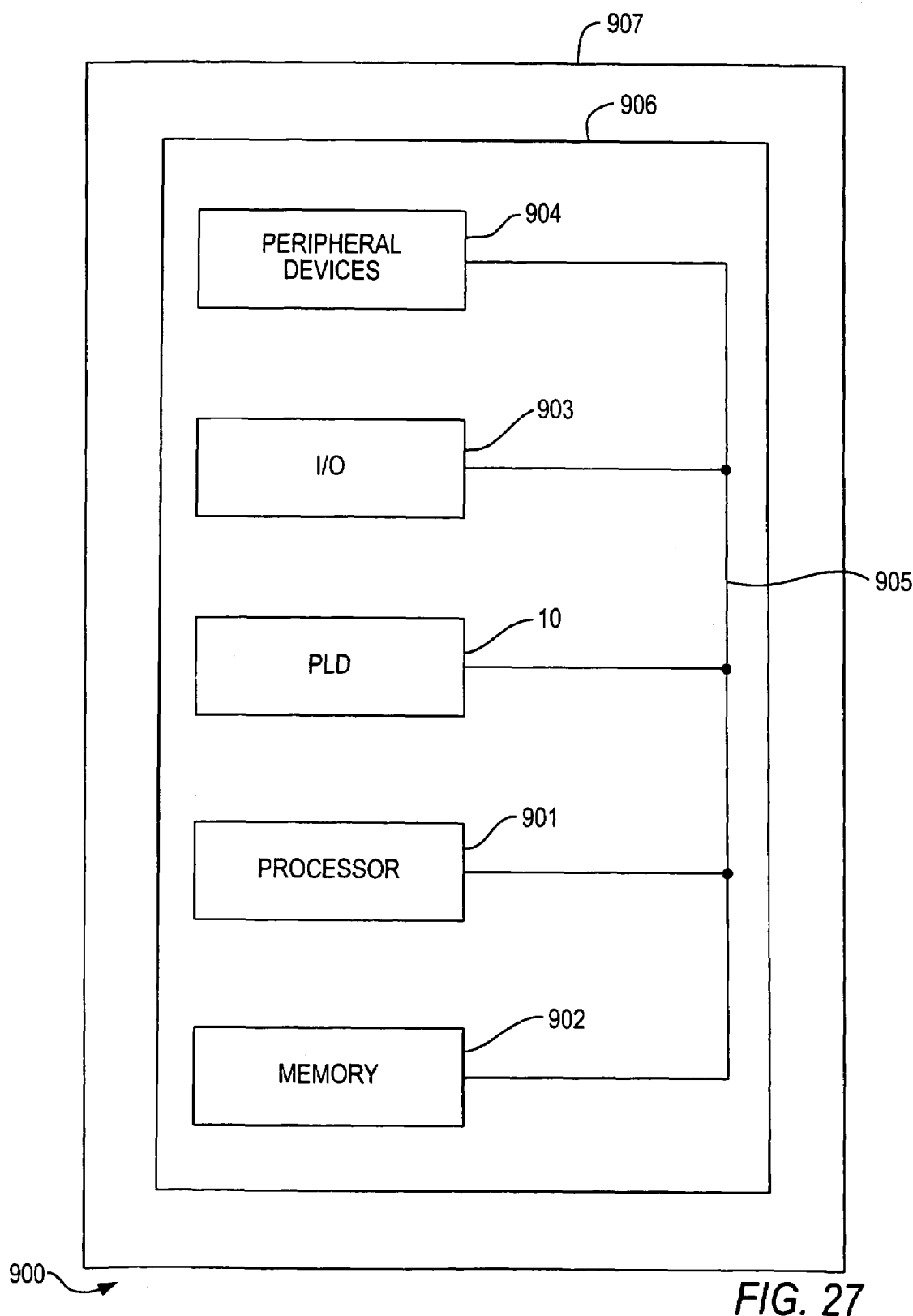
FIG. 27 is a simplified block diagram of an illustrative system employing a programmable logic device in accordance with the invention.

PLD 10 incorporating distributed RAM or shift register memory in accordance with the present invention may be used as part of a data processing system 900 shown in FIG. 27. Data processing system 900 may include one or more of the following components: a processor 901; memory 902; I/O circuitry 903; and peripheral devices 904. These components are coupled together by a system bus 905 and are populated on a circuit board 906 which is contained in an end-user system 907.

System 900 can be used in a wide variety of applications, such as computer networking, data networking, instrumentation, video processing, digital signal processing, or any other application where the advantage of using programmable or reprogrammable logic is desirable. PLD 10 can be used to perform a variety of different logic functions. For example, PLD 10 can be configured as a processor or controller that works in cooperation with processor 901. PLD 10 may also be used as an arbiter for arbitrating access to a shared resources in system 900. In yet another example, PLD 10 can be configured as an interface between processor 901 and one of the other components in system 900. It should be noted that system 900 is only exemplary, and that the true scope and spirit of the invention should be indicated by the following claims.

Various technologies can be used to implement PLDs 10 as described above and incorporating this invention.

It will be understood that the foregoing is only illustrative of the principles of the invention, and that various modifications can be made by those skilled in the art without departing from the scope and spirit of the invention, and the present invention is limited only by the claims that follow.

What is claimed is:

1. A programmable logic device configurable as a shift register, said programmable logic device comprising:
   a first plurality of logic elements, each of said logic elements having at least one programmable logic device configuration bit;
   a second plurality of controllable switches programmably configurable to connect a chain of said programmable logic device configuration bits; and first and second clock sources operating 180° out of phase from one another; wherein:

alternate ones of said controllable switches in said chain are connected to respective ones of said first and second clock sources; whereby:

each consecutive pair of said programmable logic device configuration bits in said chain forms one stage of said shift register.

2. The programmable logic device of claim 1 further comprising:

third and fourth clock sources operating 180° out of phase from one another, and leading said first and second clock sources, respectively; wherein:

each of said programmable logic device configuration bits has a clear input; and alternate ones of said clear inputs are connected to respective ones of said third and fourth clock sources.

3. A digital processing system comprising:

processing circuitry;

a memory coupled to said processing circuitry; and a programmable logic device as defined in claim 1 coupled to the processing circuitry and the memory.

4. A printed circuit board on which is mounted a programmable logic device as defined in claim 1.

5. The printed circuit board defined in claim 4 further comprising:

memory circuitry mounted on the printed circuit board and coupled to the programmable logic device.

6. The printed circuit board defined in claim 5 further comprising:

processing circuitry mounted on the printed circuit board and coupled to the memory circuitry.

7. A programmable logic device configurable as a shift register, said programmable logic device comprising:

a first plurality of logic elements, each of said logic elements having at least one configuration bit;

a second plurality of controllable switches programmably configurable to connect a chain of said configuration bits; and first and second clock sources operating 180° out of phase from one another; wherein:

said second plurality of controllable switches comprises three transistors between each configuration bit;

two of said three transistors are connected to adjacent configuration bits and are driven by one of said configuration bits, and are connected to each other at a junction;

a third of said three transistors is connected between said junction and ground;

adjacent pairs of said third transistors are driven by an identical one of said first and second clock sources, with alternate said pairs being driven by different respective ones of said first and second clock sources; whereby:

each consecutive pair of said configuration bits in said chain forms one stage of said shift register, where said respective third transistor of each said configuration bit in one said stage is driven by a different respective one of said first and second clock sources, such that boundaries between said stages are formed between configuration bits the respective third transistors of which are driven by an identical one of said first and second clock sources.

8. A digital processing system comprising:

processing circuitry;

a memory coupled to said processing circuitry; and a programmable logic device as defined in claim 7 coupled to the processing circuitry and the memory.

9. A printed circuit board on which is mounted a programmable logic device as defined in claim 7.

10. The printed circuit board defined in claim 9 further comprising:

memory circuitry mounted on the printed circuit board and coupled to the programmable logic device.

11. The printed circuit board defined in claim 10 further comprising:

processing circuitry mounted on the printed circuit board and coupled to the memory circuitry.

* * * * *